United States Patent [19]

Ramsey et al.

[11] Patent Number: 4,953,930
[45] Date of Patent: Sep. 4, 1990

[54] CPU SOCKET SUPPORTING SOCKET-TO-SOCKET OPTICAL COMMUNICATIONS

[75] Inventors: Bernard Ramsey, Springfield; Dean A. Christy, Manassas, both of Va.; Richard S. Beverly, Bowie, Md.; Jerome M. Wucher, Fairfax, Va.

[73] Assignee: Ramtech, Inc., Springfield, Va.

[21] Appl. No.: 327,708

[22] Filed: Mar. 15, 1989

[51] Int. Cl.⁵ .................................................. G02B 6/12
[52] U.S. Cl. ...................................... 350/96.11; 357/40
[58] Field of Search ........................ 350/96.11; 357/40

[56] References Cited

U.S. PATENT DOCUMENTS

| | | | |
|---|---|---|---|
| 3,418,533 | 12/1968 | Perotto | 357/40 X |
| 3,536,404 | 10/1970 | Hyman | 355/133 |
| 4,356,395 | 10/1982 | Miller | 250/227 |
| 4,373,778 | 2/1983 | Adham | 350/96.20 |
| 4,532,532 | 7/1985 | Jackson | 357/23 |
| 4,553,813 | 11/1985 | McNaughton et al. | 350/96.20 |
| 4,597,631 | 7/1986 | Flores | 350/96.20 |
| 4,695,120 | 9/1987 | Holder | 350/96.11 |
| 4,696,536 | 9/1987 | Albares et al. | 350/96.19 |
| 4,703,471 | 10/1987 | Fitelson et al. | 370/1 |
| 4,732,446 | 3/1988 | Gipson et al. | 350/401 |

FOREIGN PATENT DOCUMENTS

| | | |
|---|---|---|
| 53-84586 | 7/1978 | Japan . |
| 0012450 | 1/1983 | Japan . |
| 58-93268 | 3/1983 | Japan . |
| 58-3506 | 10/1983 | Japan . |
| 83/03506 | 10/1983 | PCT Int'l Appl. . |

OTHER PUBLICATIONS

*FYI, TI Semiconductors*, vol. 5, Issue 6, Jul. 1988, "NuBus: A New Standard for 32-Bit PCs", pp. 2 & 4.
*Federal Computer Week*, Aug. 1, 1988, "AT&T Bell Labs Builds Optical Digital Computer", p. 52.
*Electronics Weekly*, May 12, 1988, "Speedy 16-Bit Computer Microcontoller Tackles Real-Time Application", pp. 45-50.
*Electronic Products*, Jul. 15, 1988, "Molded Circuit Assemblies . . . at the Starting Line", pp. 33-37.
*Electronic Design*, Jul. 28, 1988, "RISC Microprocessors: Many Architectures Thrive", pp. 49-58.
Information Processing Systems Open Systems Interconnection Basic Reference Model, ISO Draft Proposal, ISO 7498, Feb. 4, 1982.
*Electric Design*, Jun. 23, 1988, "Optical Bus Speeds Up PC-Board Signals", p. 31.
*IEEE Transactions of Software Engineering*, No. 3, "Design Tradeoffs for Process Scheduling in Shared Memory Multiprocessor Systems", pp. 327-334, Mar. 1989.
*Computer Design*, "Hybrid Board Scheme Bridges Optical and Electrical Circuitry", Oct. 15, 1988, pp. 38-41.
*Electronic Design*, "Speedy 16-bit Computer Microcontroller Tackles Real-Time Application", vol. 36, No. 11, pp. 45-50, May 12, 1988.

Primary Examiner—William L. Sikes
Assistant Examiner—Phan T. Heartney
Attorney, Agent, or Firm—Nixon & Vanderhye

[57] ABSTRACT

A communication socket hereinafter referred to as the "CPU socket" and its preferred methods of integration into conventional electronic circuits are described. The CPU socket advantageously uses hybrid devices embedded within a conventional integrated circuit (IC) socket. Circuit connectivity is maintained via photon transmission without the need of conventional metallic connections. Typical problems associated with metallic traces, circuit board geometries, packing densities and parasitic limitations of conventional PCB's are eliminated. The CPU socket emulates all of the physical aspects of PCB metallic etched traces via a photon mechanism. The CPU socket supports system networking functions normally available only in large "intra" and "inter" computer communications facilities, and reduces system networking design down to socket/PCB level. Additionally, the CPU socket generates the power necessary for operation as well as that needed by hosted IC's via photovoltaic devices contained within the CPU socket. The voltaic devices may be driven by any natural or artificial photon source of sufficient intensity to power the socket and piggy-back IC.

21 Claims, 12 Drawing Sheets

CPU SOCKET SUPPORTING SOCKET-TO-SOCKET OPTICAL COMMUNICATIONS

BACKGROUND OF THE INVENTION

The microcomputer industry is continually increasing the size, capabilities, and performance of its microcomputers (desk top, portables, lap top, etc.). Technology, however, is quickly reaching practical, if not theoretical, limits in the size and performance of printed circuit boards (PCBs).

The capabilities of Central Processing Units (CPUs) continue to increase in functionality and performance. The families of CPUs offered by Intel, for example, have steadily increased from 8 to 16 to 32 bits and from 4 MHz to 20 MHz or higher. The heavy competition between microprocessor manufacturers in the marketplace causes a continual increase in system capabilities, functionality and performance—while at the same time reducing the cost to the consumer. Unfortunately, even as CPU performance and speeds increase, PCBs are constrained to remain the same size or even decrease in size.

Although PCB design, technology, and capabilities have improved over the years, PCBs are designed and fabricated today based on fundamentally the same technical concepts as when they were first introduced. They still rely on etching the metallic circuit or system interconnect pathways upon some form of substrate and soldering the components (e.g, integrated circuits (ICs) and the like) to the metallic pathways. PCB component packing densities are being pushed to their limits. Unfortunately, as packing densities increase, both part counts and CPU sizes increase. In addition, system speeds and throughputs are constrained (and are now reaching their practical limits). Current PCB based systems are also very susceptible to disruption due to electromagnetic interference (EMI), radio-frequency interference (RFI), electromagnetic pulse phenomena (EMP), etc.

Current technology offers limited immediate solutions in the form of PCB layouts, board geometries, and integrated circuits that significantly improve system speed. Unfortunately, current technical capabilities, designs, and applications using various methods of photo and light transmission, IC socket design, and new board technologies are not being developed to their fullest potentials.

An effort to bridge this gap is demonstrated in U.S. Pat. No. 4,695,120 issued to J. D. Holder and U.S. Pat. No. 4,732,446 issued to L. Gipson et al. Both of these disclosures relate to attempts to incorporate fiber optics within the framework of the integrated circuit. This is, however, a very cumbersome method both in an electrical as well as a mechanical sense. An article in Computer Design, Oct. 15, 1988, "Hybrid Board Scheme Bridges Optical and Electrical Circuitry", pp. 38–41, very accurately points out that the state-of-the-art in miniature and micro fiber optics has a long way to go to produce an effective product.

INFORMATION DISCLOSURE STATEMENT

In addition to the documents discussed above, the following additional documents may also be relevant to the invention described and claimed herein:
U.S. Patent Documents
U.S. Pat. No. 4,356,396 to Miller
U.S. Pat. No. 4,373,778 to Adham
U.S. Pat. No. 4,553,813 to McNaughton et al
U.S. Pat. No. 4,532,532 to Hyman et al
U.S. Pat. No. 4,597,631 to Flores
U.S. Pat. No. 4,696,536 to Albares et al
U.S. Pat. No. 4,703,471 to Fitelson et al
Foreign Patent Documents
No. 53-84586—July 1978—Japan
No. 58-93268—Mar. 1983—Japan
83/03506—Oct. 1983—PCT Int'l Appl'n.
0012450—Jan. 1983—Japan
Other Publications
FYI, TI Semiconductors, Volume 5, Issue 6, July 1988, "NuBus: A new standard for 32-bit PCs", pp. 2–4.
Federal Computer Week. August 1, 1988, "AT&T Bell Labs Builds Optical Digital Computer",
Electronics Weekly, May 12, 1988, "Speedy 16-bit computer microcontroller tackles real-time application", pp. 45–50.
Electronic Products, July 15, 1988, "Molded circuit assemblies . . . At the starting line", pp. 33–37.
Electronic Design, July 28, 1988, "RISC Microprocessors: Many Architectures Thrive", pp. 49–58.
Information Processing Systems Open Systems Interconnection Basic Reference Model, ISO draft proposal, ISO 7498, Feb. 4, 1982.
Electronic Design, June 23, 1988, "Optical Bus Speeds Up PC-Board Signals", p. 31.
Integrated Device Technology, Jan. 1988, "High Performance CMOS Data Book".
"Design Tradeoffs for Process Scheduling In Shared Memory Multiprocessor Systems", 15 IEEE Transactions of Software Engineering No. 3 pp. 327–334 (March 1989).

SUMMARY OF THE INVENTION

The present invention provides at least two major areas of PCB and component design innovation to advance the art beyond existing design limits. Both areas are in consonance with each other and follow a natural design integration.

The first area relates to supporting inter IC communications and applications workloads via photon transmission. In accordance with this first important feature of the present invention, the art of circuit interfacing and circuit topology is elevated by providing a system obviating the need for any form of physical circuit connection between discrete or integrated devices. This sets the stage for a quantum leap in PCB and IC/component interconnect design—and releases the designer from the conventional use of printed circuit boards and evolves into a much simpler, easier to fabricate, cost effective circuit board. While conventional metallic etched traces may be used, these are not mandated by design for purposes of transmitting intelligence using a CPU socket arrangement provided by a second important feature of the present invention.

The CPU socket arrangement provided by the second area of the present invention brings higher speed and more capable circuitry (in the form of ICs and plug-in modules/subassemblies) together with more capable and broader utility of a free geometric design technology. The CPU socket design of the preferred embodiment provides the physical and geometric standard to support the interconnection between the CPU socket and the existing devices utilizing various elements of photoelectric, photovoltaic, and application type designs (function modules)—and emulates the metallic "hard-wired" connections appropriate to the host IC while performing actual communications using more efficient and rapid optical data transmission techniques. The CPU socket also may provide the packaging mechanism to house the optics and/or integrated circuitry.

Additionally, the CPU socket provides a means of elevating PCB design beyond current practical limits of performance, size and bandwidth using today's fabrication and other technologies. CPU sockets allow the design of the PCB and subsequent layout to support variable component sizes and geometries while reducing or eliminating the need for conventional metallic traces between component ICs. In so doing, the CPU socket provides dedicated processing power to typical hosted ICs as well as a multitasking environment for circuit design.

Briefly, one aspect of the present invention provides an intelligent component socket in place of the prior art socket. While prior art IC sockets generally provide merely an electrical/mechanical mechanism for establishing a reliable, disengageable electrical connection between an integrated circuit and a PCB, the socket provided by the present invention actually provides an active interface with expanded support and interface functionality not available in the past on the single chip level (or even printed circuit board level). An important feature of the invention is to treat each hosted IC as an essentially independent functional module—and to provide support functions in the socket the hosted IC is plugged into. This support functionality is programmable to interface efficiently with the specific hosted IC, and presents to the "outside world" (i.e., to other components on the PCB) a generic communications interface that facilitates peer-to-peer communications between sockets.

In conventional microprocessor based systems, for example, ICs are designed in "families" to be compatible with other members of the family. A math coprocessor IC and a high speed RAM IC may be designed to directly interconnect with a certain type of microprocessor IC (e.g., "microprocessor A"). Unfortunately, a different math coprocessor or a different memory IC designed to interconnect with a different type of microprocessor ("microprocessor B") cannot typically be used with microprocessor A due to mechanical differences (e.g., number of address pins), electrical differences (operating voltage levels), and/or functional differences (operational sequences, required signal sequences, bus sizes, or the like)—unless complex and expensive (in terms of component and design cost, reliability and PCB "real estate") interface circuitry is provided. The present invention provides a generic interface for each hosted IC—so that, for example, a given microprocessor can be used with many different types of support ICs (even with ICs that could not in the past be used with the microprocessor due to incompatibility problems) or even different bus sizes (for example, an 8-bit CPU could be made compatible with another 16-bit CPU).

In the present invention, this generic interface provided on the IC level may include much functionality in addition to that needed to merely communicate data and control signals to and from the IC. For example, the socket into which the hosted IC is plugged into may actually include local area network (LAN) type communications handling capabilities of the type used in the past to interface host computers. Such capabilities may include, for example, error checking and data reliability functions; message addressing and selection; message queueing and prioritizing; self-configuration and dynamic reconfiguration; diagnostic and design debugging support; and multitasking capabilities. Such features and functions have never before been available at the IC level.

The CPU socket provided by the present invention permits integrated systems features normally reserved for large "intra" and "inter" computer facilities design to be provided at the printed circuit board level. Future microcomputer, industrial control and general hardware designers will be able to perform many background system chores (formerly performable only at the module level) down at the CPU socket/IC level. For example, many control and monitoring features are provided at the plug-in CPU socket level in the preferred embodiment. Since each socket may contain a fully functional reduced instruction set computer (RISC), the designer has has better control over the hosted IC, inter-IC communications as well as background computer processing capabilities such as multitasking, parallel processing, cache memory techniques, and reconfigurable design in the event of component failure.

The implementation of these features can be accomplished using conventional integrated circuit techniques. ASICs can be embedded in the various CPU sockets similar to the way current technology produces conventional ICs (dual in-line packages (DIPs)), flat packs, vertical arrays, and pin grid arrays (PGAs)). One significant difference, of course, is the fact that the circuitry provided by the present invention is based upon supporting photon data transmissions. The design that is embedded in the various CPU sockets of the preferred embodiment can be specifically tailored to the device that will be inserted into the sockets (for example, the functionality of the CPU socket can be embedded within the above-mentioned IC socket types).

The CPU socket provided by the present invention allows the targeted IC device to "communicate" with other components (ICs) via photon methods rather than electric signals transferred on metallic traces. All of the supported levels of design and layers of communication/protocol are transparent between the targeted ICs of any particular design—allowing the hardware system designer to worry only about the functionality of his design and freeing him from having to concentrate on the details or limitations of PCB design.

A further major feature offered by the CPU socket provided by the present invention is to provide alternative methods of bringing power to conventional ICs and plug-in subassemblies and/or modules. The CPU socket of the preferred embodiment contains photovoltaic devices advantageously embedded (or molded) within its structure to provide for the power requirements of the CPU socket as well as hosted IC devices plugged into the CPU socket. The photovoltaic devices included in the CPU socket provide all power necessary to be placed directly on socket power pins (such as Vcc or to allow conventional external sources of power to be applied to said pins). Internal lithium batteries may also be molded into the socket and diode ORed to the Vcc power bus to provide power during periods of low or insufficient ambient lighting conditions or for operation in hostile ambient light environments. This self-contained method of power generation/distribution allows a single CPU socket to support various IC devices such as TTL, ECL, CMOS with the appropriate signal level via the use of internal software-programmable DC-to-DC converters—thus allowing the designer to mix and match different IC devices and technologies within a single design.

The advantages provided include the benefit of IC device functionality irrespective of the type of semiconductor technology and various power requirements. Total device power isolation is provided and subsequent propagation of power supply parasitics are eliminated.

BRIEF DESCRIPTION OF THE DRAWINGS

These and other features and advantages of the present invention will be better and more completely understood by referring to the following detailed description of presently preferred exemplary embodiments in conjunction with the appended sheets of drawings, of which.

DETAILED DESCRIPTION OF PRESENTLY PREFERRED EXEMPLARY EMBODIMENTS

Figure 1:
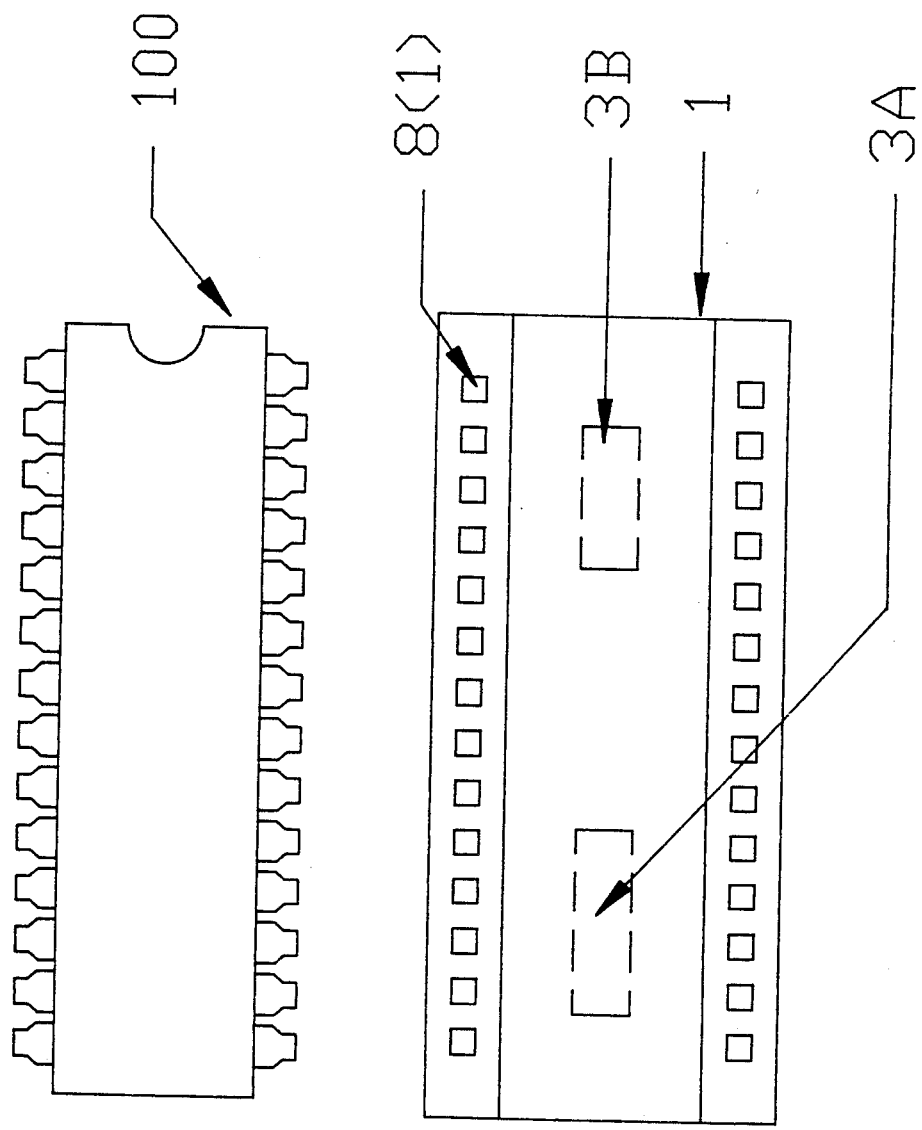
FIG. 1 is a top view of the presently preferred exemplary embodiment of a CPU socket in accordance with the present invention.

FIG. 1 is a top view of the presently preferred exemplary embodiment of a CPU socket 1 in accordance with the present invention. CPU socket 1 in the preferred embodiment is capable of supporting a twenty-eight pin standard dual-inline package (DIP) type integrated circuit (IC) 100 plugged into the twenty-eight corresponding pin sockets 8 (although the CPU socket may be modified to support various typical conventional ICs ranging in size from eight pins to one hundred forty pins, for example). The double row of IC pin sockets 8 is dimensioned based upon industry standards for IC pin placement (for example, DIP, PGA, vertical arrays, edge connector sockets, etc.). Various types of hosted IC devices such as conventional central processing units (CPUs), memories, coprocessors, video drivers, etc. may be inserted into the CPU socket 1 from the top via the conventional IC sockets 8 provided for IC pin insertion.

Molded within the CPU socket 1 is one or more hybrid application specific integrated circuit (ASIC) communication/support chip(s) 3A, 3B. Contained within ASICs 3A, 3B in the preferred embodiment is the integrated circuitry necessary to support various functions supporting the hosted IC 100 plugged into socket 1 as well as overall system-type functions—including for example socket-to-socket communication, emulation services necessary to replace conventional metallic traces, a CPU with cache memory, EEPROM, system clock, first-in-first-out (FIFO) registers, and power supply regulation and isolation for photovoltaics (as will be explained shortly).

Figure 2:
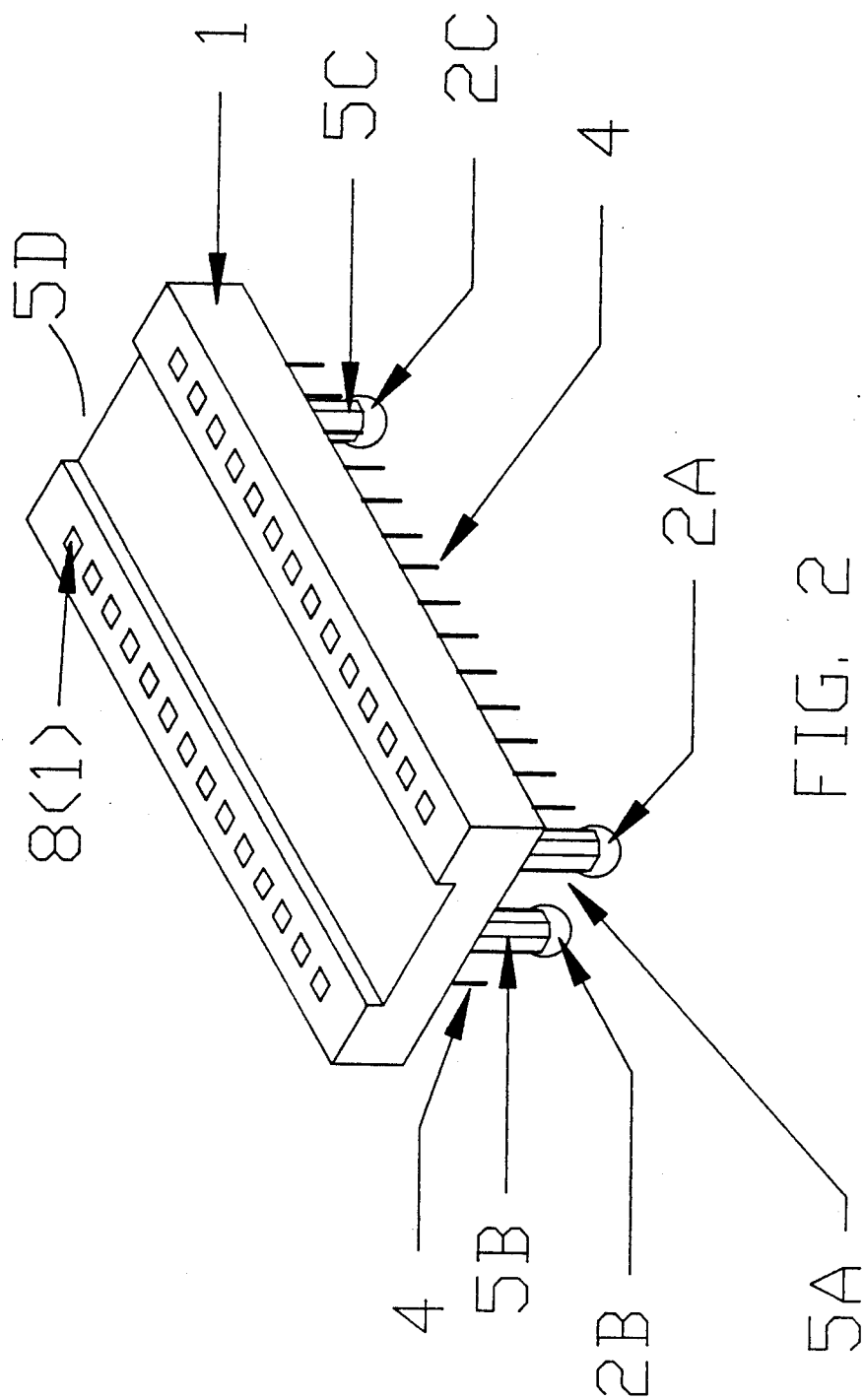
FIG. 2 is a perspective view of the FIG. 1 CPU socket.

FIG. 2 is a perspective view of the CPU socket 1 showing said socket's metallic pins 4. IC pins 4 protruding from an underside surface 102 of socket 1 are designed to support standard IC pin sizes and spacing to facilitate the installation of the CPU socket using conventional printed circuit board (PCB) layouts. Four transceiver power columns 5(A)-5(D) are integrally molded to the CPU socket 1 on the underneath side 102 of said socket and inboard of the dual row of socket pins 4 in the preferred embodiment. Each transceiver power column 5 supports an epoxy spherical lens 2 to provide for the transmission of light omnidirectionally.

Figure 3:
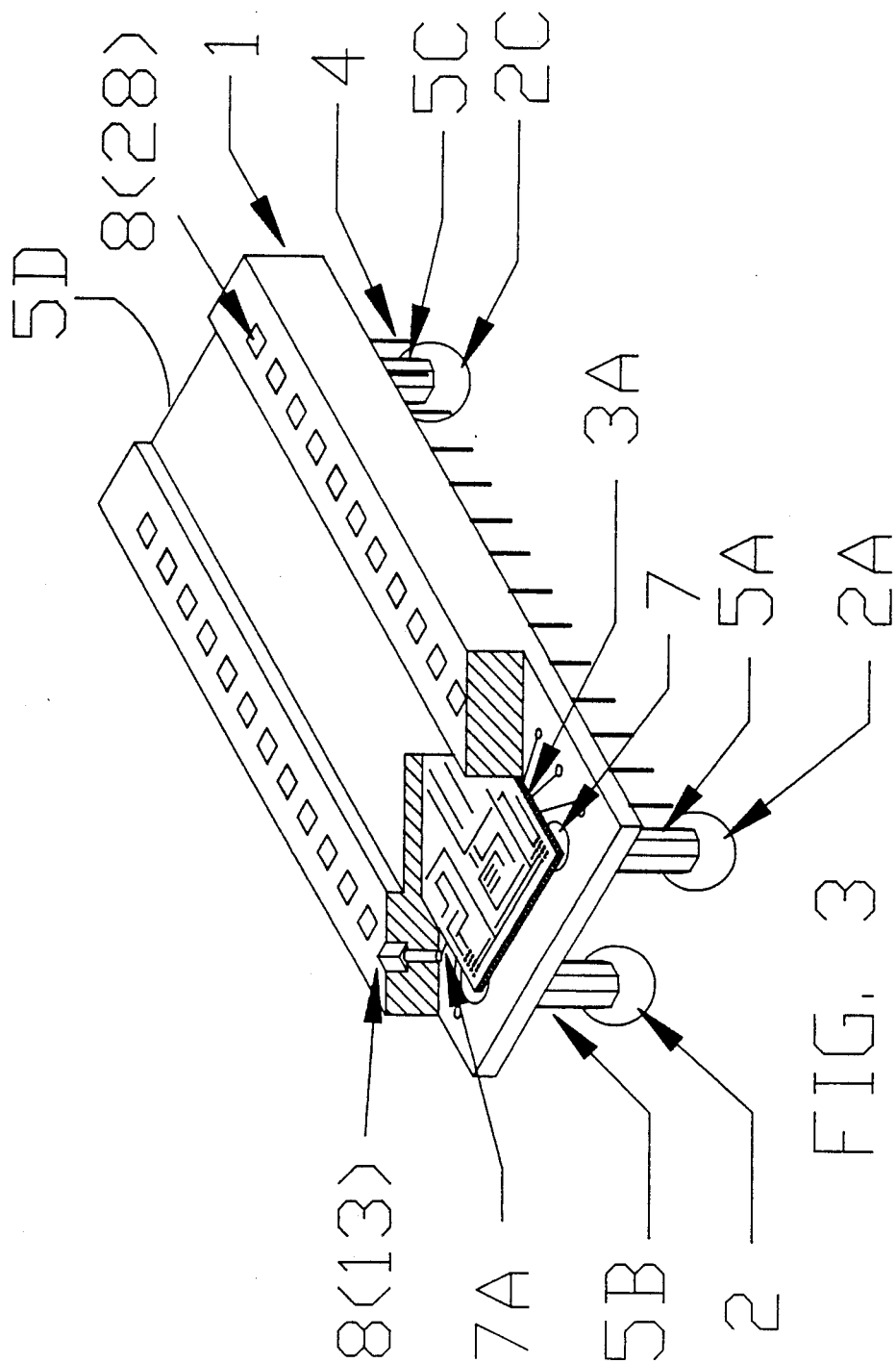
FIG. 3 is a perspective cutaway view of the FIG. 1 CPU socket detailing the ASIC and the ASIC-to-transceiver column interface.

FIG. 3 is a perspective cutaway view of the CPU socket 1 showing details of the embedded bybrid ASIC chips 3A, 3B and associated metallic wiring 7 connected to the transceiver power column 5. A cutaway view of exemplary socket 8 shows a metallic trace 7A connecting the socket 8 to the circuitry of the ASICs 3A, 3B.

Figure 4:
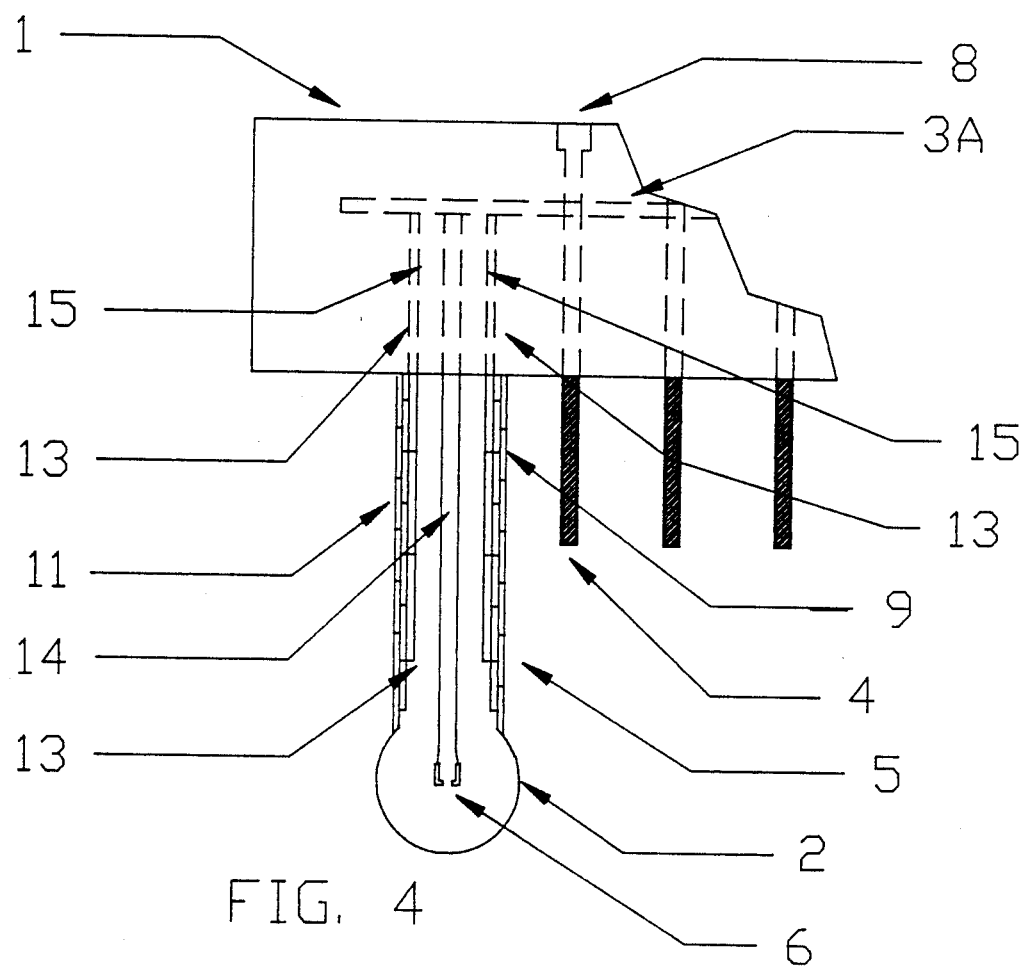
FIG. 4 is a front view of the FIG. 1 CPU socket with a cutaway section detailing the transceiver column.

FIG. 4 is a partial front view of CPU socket 1 enlarged to show a cutaway view of one of the four transceiver power columns 5. The relationship of the ASIC 3 to the IC socket(s) 8 and conventional IC pins 4 are shown along with internally deposited metallic traces 13, 14 and 15. In the preferred embodiment, metallic trace 13 constitutes a power bus; trace 14 is a transmit bus; and trace 15 is a receive bus. Each transceiver column 5 in the preferred embodiment may be formed by standard methods whereby injection-molding thermoplastic resins are shaped into two and three-dimensional solids to form the basic CPU socket 1 and transceiver column 5. This general process and the design capabilities provided by it are further described in the previously-referenced article by S. Chin in Electronic Products, July 5, 1988, "Molded circuit assemblies . . . At the starting line", pp. 33–37.

Alternate external receive panels 9 are provided in the preferred embodiment on the exterior surfaces of power column 5. Panels 9 are composed of light sensitive material, using specific semiconductor materials for specific corresponding desired optical frequencies. Panels 9 connect to a metallic trace array 15 and combine to provide photon receive circuitry.

The optical wavelengths at which the receive panels 9 and an LED light transmitter 6 (provided at a distal portion 104 of column 5) operate is a function of the energy bandwidth (where $E_w$=energy bandwidth in electron volts) of the selected semiconductor material. The energy bandwidth is generally defined as the difference between the donor and acceptor levels—as is well known to those skilled in this art. For example, a gallium arsenide (GaAs) LED with an energy bandwidth of $E_w=1.37$ eV emits a radiation at a wavelength of approximately 0.903 microns. This wavelength of light falls within the infrared region of the radiant energy spectrum. In like manner, gallium phosphide (GaP) emits a radiation wavelength of approximately 0.700 microns which falls within the red region of the visible spectrum. In the preferred embodiment, the semiconductor material used in the transceiver column 5 is gallium arsenide because of its spectral emissions at the infrared region. This region of emission results in a typically low atmospheric absorption of the radiant energy. However, it should be noted that multiple light emissions (using different wavelengths) may be used, for example, to support multiple channels or improved communications during periods of hostile ambient light environments.

Pulses of photons received by panels 9 are transduced to voltage/current electrical signals in a conventional manner by one or more phototransistor structures (not shown in FIG. 4) and coupled via the receive bus 15 to an input FIFO buffer (not shown in FIG. 4) in the ASIC 3. In like manner, output pulses are transferred to the transmit bus 14 from the ASIC 3, and drive the transmit LED 6 molded within an epoxy, transparent, spherical lens 2. The properties of lens 2 are such that the transmitted light (photon) pulses are radiated omnidirectionally and simultaneously from each of four transceiver columns 5 in the preferred embodiment.

An array of further alternate photovoltaic panels 11 also provided on the exterior surface of power column 5 transduce incident photon energy (of appropriate light frequencies and intensity) to electrical current. This electrical current is then coupled to provide operating power to the ASIC 3 via a metallic power bus 13 array. The photovoltaic array 11 is capable of providing enough power to drive all the circuits of the CPU socket 1, including the ASIC 3, LED 6, and receive panels 9, as well as a hosted IC 100 mounted in said CPU socket 1 via conventional IC pin sockets 8. All power necessary for the hosted IC 100 is provided in the preferred embodiment via the photovoltaic array 11 and coupled to said IC through internal ASIC 3 DC-to-DC converters, metallic IC pins 4 and thus to the IC sockets 8 in the preferred embodiment. Conventional opto-semiconductor structures (e.g., "solar cell" type arrangements) for use as components of photovoltaic array 11 which have the power handling capabilities and efficiencies required for powering ASICs 3A, 3B, hosted IC 100 and LED 6 at standard operating voltages are well known to those skilled in this art.

Figure 5:
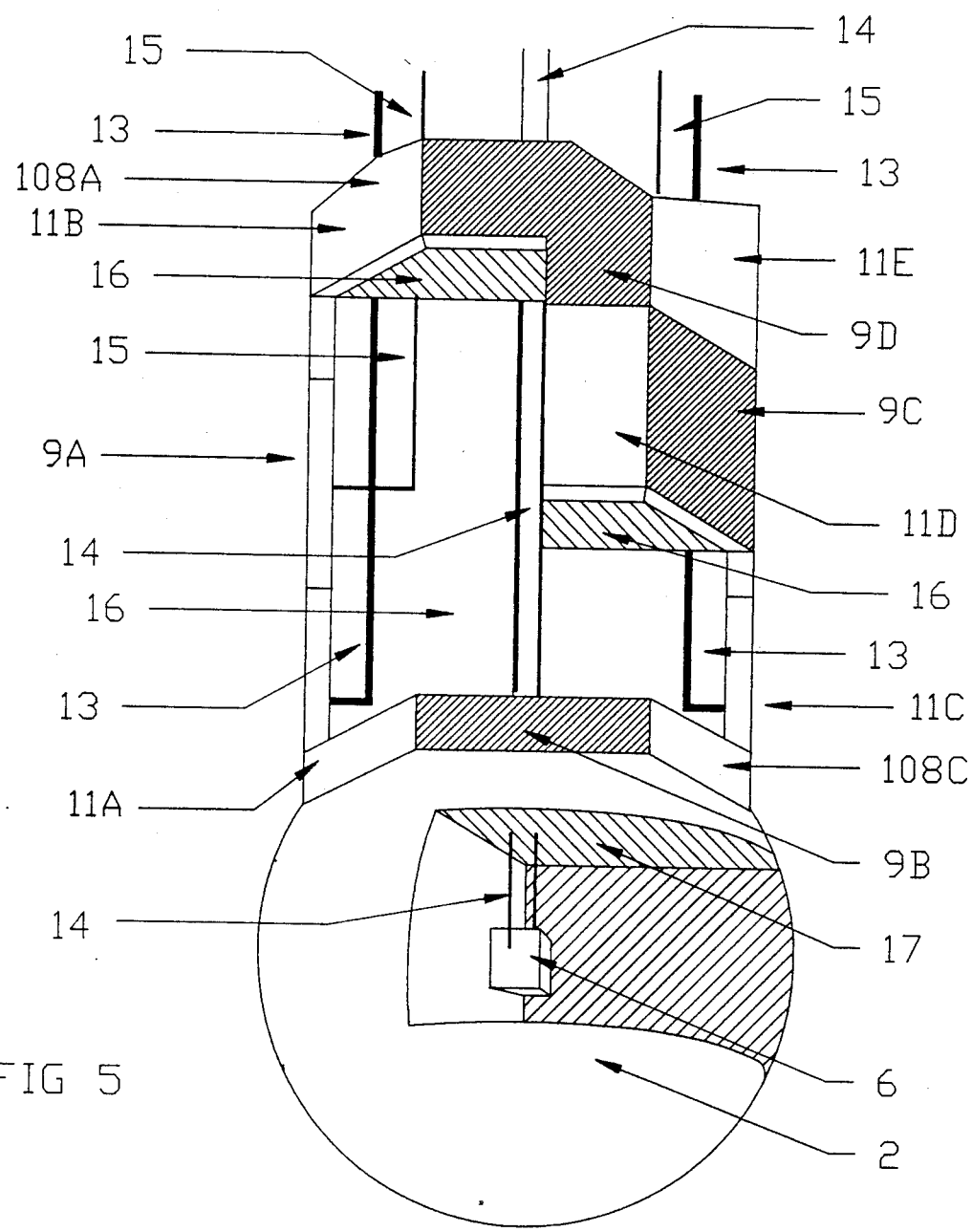
FIG. 5 is an enlarged perspective view of the FIG. 4 transceiver column with cutaway portions showing details of the photo-optic receiver and photovoltaic panels along with the LED bead.

FIG. 5 details an enlarged perspective sectional view of the multi-sided transceiver power column 5 shown in FIG. 4. In the embodiment shown, the preferred shape at column 5 is a six-sided (hexagonal) elongated structure providing six exterior planar face surfaces (facets) 108. In the preferred embodiment, these facets 108 are each covered with light (photon) sensitive semiconductor material, with alternate facets 108 used for bearing receiver panels 9 and photovoltaic panels 11. Panels 9, 11 are thus distributed around the hexagonal circumference of the column 5 as well as vertically from the bottom of the CPU socket 1 (shown in FIG. 4) to the epoxy spherical lens 2. In other words, receive panels 9 and photovoltaic panels 11 may alternate about the circumference of power column 5, and may also alternate down the length of each power column facet 108 in the preferred embodiment. This provides a 360 degree field for receiving light signals at the receiver 9 and photovoltaic panel 11 per column 5. Photonic transmission is accomplished via the transmit bus 14 by applying a voltage to the LED 6 which radiates light into a diffracting epoxy lens material 17 of lens 2—thus causing the entire spherical lens 2 to radiate photons in a 360 degree spherical field.

Figure 6:
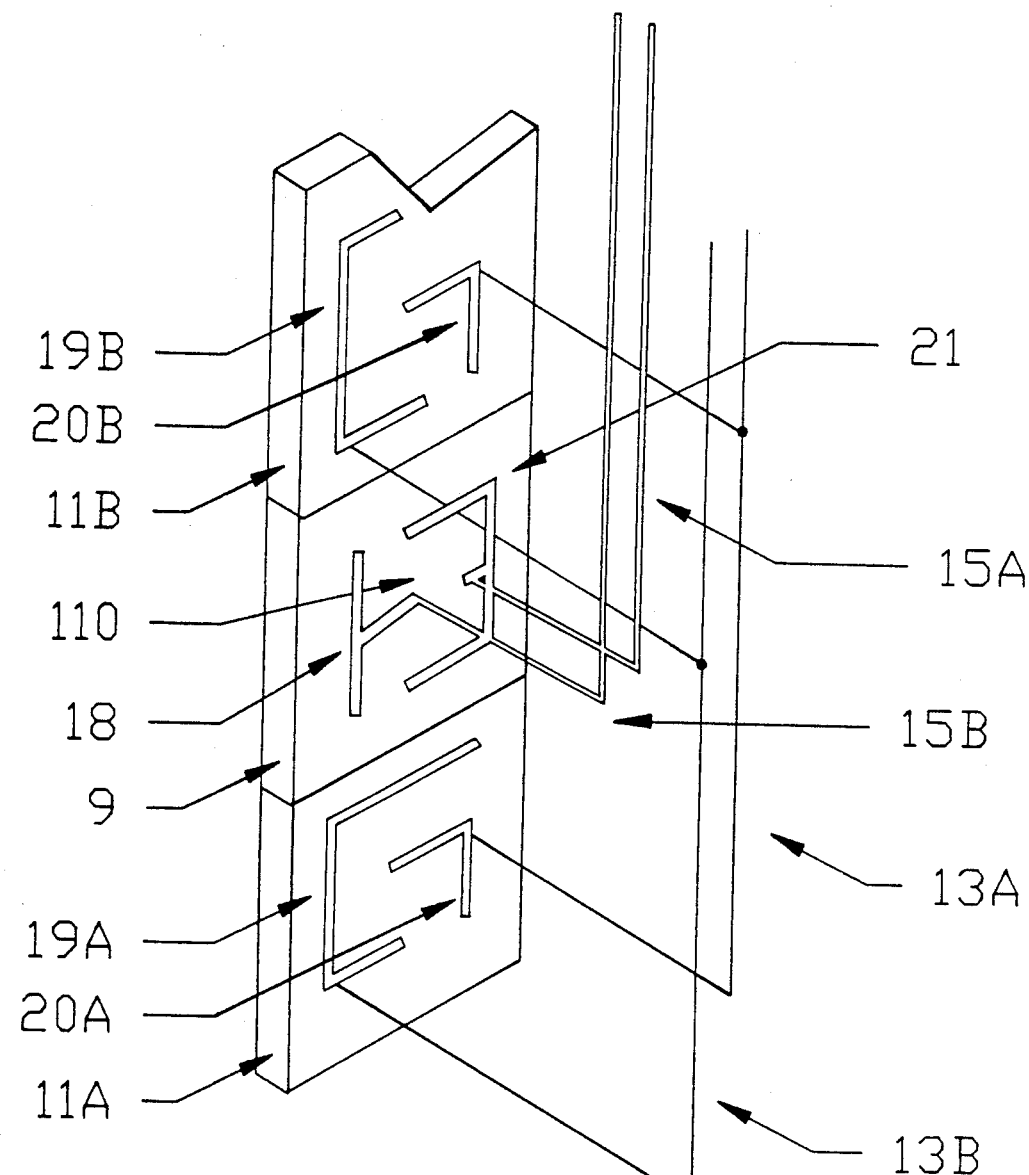
FIG. 6 is a perspective view of the transceiver column of the FIG. 1 CPU socket.

FIG. 6 is a perspective view of an exemplary vertical array of alternating photovoltaic panels 11 and receive panels 9 as seen from within the column 5. The single vertical array (one of six in a hexagonal geometry) is the preferred embodiment allowing the advantageous use of photon reception in a wide overlapping viewing angle. The photovoltaic panels 11 support a cathode 19 and anode 20 attached to common power bus 13. The receive panels 9 include a photo receiver transistor (shown generally at 110) including a base region 18 and an emitter region 21 connected in parallel to receive bus 15 (these regions are entirely conventional in structure and fabrication and are therefore shown only schematically in FIG. 6). In another embodiment (not shown), an entire column external surface facet 108 is covered by receive panels 9 and its adjacent facets is covered entirely by photovoltaic array 11—with alternating facets bearing different types of structures (i.e., a first, third and fifth facet bear receive panels 9, and the remaining facets bear photovoltaic arrays 11, for example).

Each transceiver column 5 is capable of supporting a full duplex, asynchronous, serial mode of communications via photonic transceiving methods. Due to the fact that the different received signals are optical rather than electrical or RF, no or negligible interference between the different optical signals occurs (as is well known to those in this art). In the preferred embodiment, the optical signals received by the columns 5 are encoded with different digital addresses corresponding to the columns to permit the portions of ASICs 3A, 3B associated with the columns to determine which signals were intended to be received by each column and which signals were intended to be received by another column (or another socket 1). In the preferred embodiment, a socket 1 is thus capable of supporting four simultaneous, full duplex, asynchronous, communication channels (each column 5 supporting a different channel). Alternately, columns 5 can be controlled via ASIC circuitry 3 (shown in FIG. 3) to allow all four columns 5 to transceive in parallel for extremely high data throughput rates with low bit error rates in hostile operating environments or complicated line-of-sight board layouts. The probability of sustained optic bus communication is thus enhanced—and by using four separate channels the efficiency of multiprocessing and multitasking communication chores is enhanced.

FIG. 5 further depicts the metallic transmit bus leads 14 driving the LED 6, the metallic leads of the receive bus 15, and the metallic leads of the power bus 13 all embedded within an opaque, nonconductive, epoxy filler 16 forming the primary structure of column 5. The epoxy filler 16 is the principal bonding material supporting the receive panel 9, voltaic panel 11 and transmit lens 2 geometries and providing a cantilever type structural support to the CPU socket 1 in the preferred embodiment.

The CPU socket 1 and ASICs 3A, 3B in the preferred embodiment support additional system requirements such as the emulation of conventional PCB circuitry used to provide IC connectivity on the control, data, and address buses. Such capabilities allow conventional PCB circuitry to be configured as a series of self-contained communicating IC sockets similar to a local area network (LAN) on any appropriate substrate that provides line-of-sight access for each socket's photo-optic (photon) interface used for system and socket level communication. Spherical lens 2 may also transmit signals to other sockets 1 via conventional fiber optic media when line-of-sight transmission is not possible (e.g., between electronic modules located in the engine compartment of an automobile, aircraft or the like and modules located in the passenger compartment). The CPU socket 1 provides all necessary power for internal circuitry as well as the hosted IC 100 circuitry and all necessary internal clock functions as well as supporting hosted IC clock functions.

In the preferred embodiment, ASIC 3 is preferably a general purpose structure capable of interfacing with many different types and technologies of hosted ICs 100. The embodiment disclosed herein (by way of example only) supports as hosted IC 100 a commercially available 256K complementary metal oxide semiconductor (CMOS) static random-access memory (SRAM) having any one of several conventional architectures (such as 16K×16). It should be noted that the disclosed CPU socket 1 and ASIC 3 is capable of supporting all families of currently available commercial memory, the 256K CMOS SRAM being described only by way of example, and commonly used CPUs, coprocessors, etc.

Figure 7:
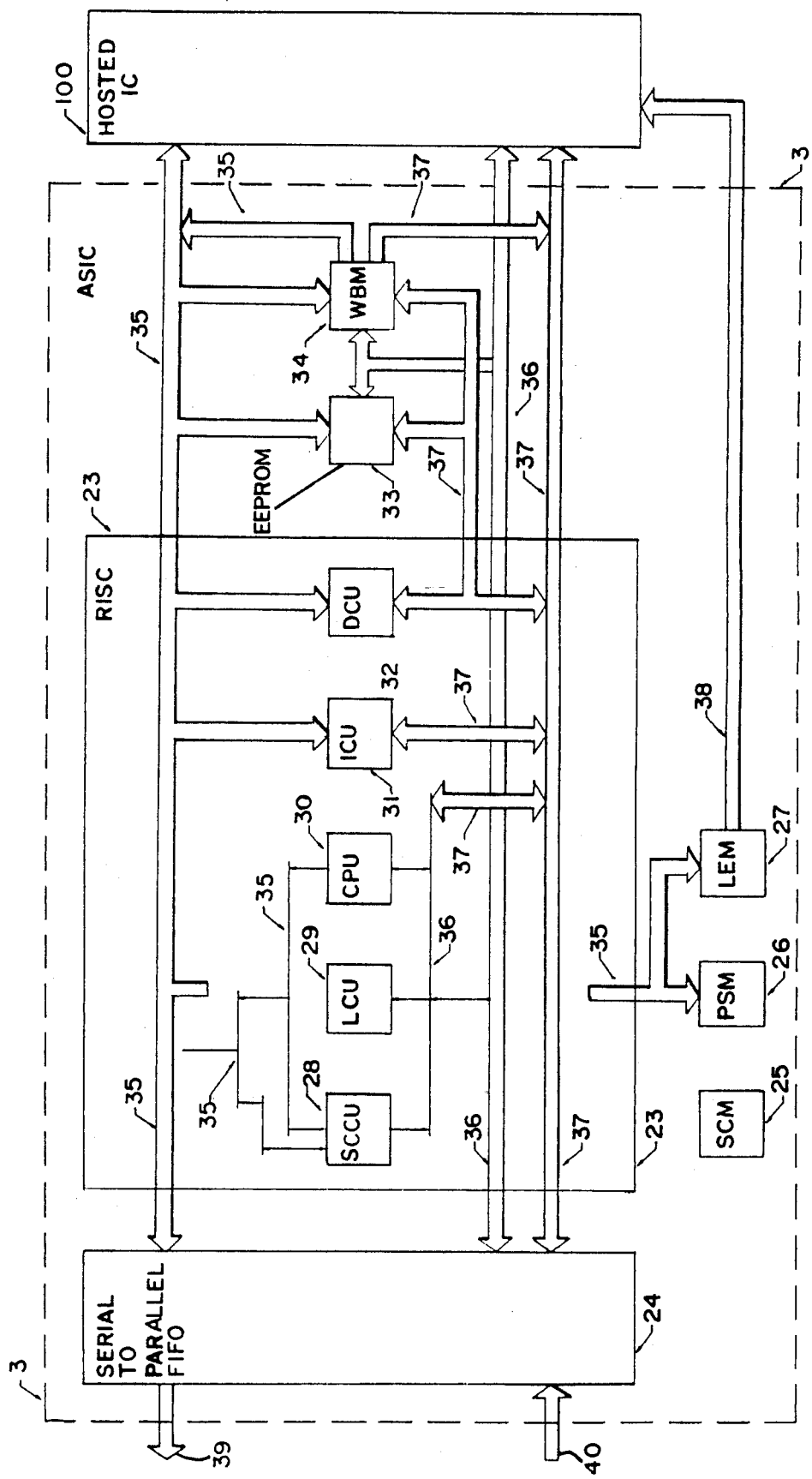
FIG. 7 is a a functional block diagram of the ASIC components within the FIG. 1 CPU socket.

FIG. 7 is a functional block diagram of the ASICs 3A, 3B shown schematically in FIG. 1. The function block diagram shown in FIG. 7 shows those modules in the ASICs 3A, 3B used to support the system requirements of the CPU socket 1 in the preferred embodiment. The functionality of the preferred embodiment socket 1 is provided in large part by the advantageous use of large-scale integration (LSI) circuitry comprising embedded ASICs 3A, 3B. The ASICs 3A, 3B (hereafter collectively referred to as "ASIC 3" since the division of actual circuitry between different ASIC "chips" is largely a matter of design and manufacturing choice) is composed of five basic elements comprising a general purpose microcomputer in the preferred embodiment: namely a control unit (CU), an arithmetic logic unit (ALU), memory, input circuitry, and output circuitry.

The CPU socket 1 in the preferred embodiment is thus a fully functional microcomputer with the exception of keyboard and video capabilities. The ASIC 3 microcomputer implements computer elements and programming capabilities via four basic function modules in the preferred embodiment. These modules are contained within the ASIC 3 and include a reduced instruction set computer (RISC) 23, a serial-to-parallel first-in-first-out (FIFO) module 24, an electrically erasable programmable read only memory (EEPROM) 33, and a write buffer memory 34. The ASIC 3 also contains three system support modules in the preferred embodiment: the system clock module (SCM) 25, the system power supply module (PSM) 26, and the logic emulator module (LEM) 27.

In the preferred embodiment, four buses 35, 36, 37 and 38 are used to interface the ASIC 3 components with one another and with the hosted IC 100. In the preferred embodiment, ASIC 3 adapts to different hosted ICs in response to IC characteristic tables stored in EEPROM 33. Programmable DC-to-DC power converters 265 connected between the ASIC 3 components and the hosted IC 100 convert ASIC operating signal voltages to the signal voltages required by the hosted IC in response to conversion information stored in EEPROM 33.

Figure 7A:
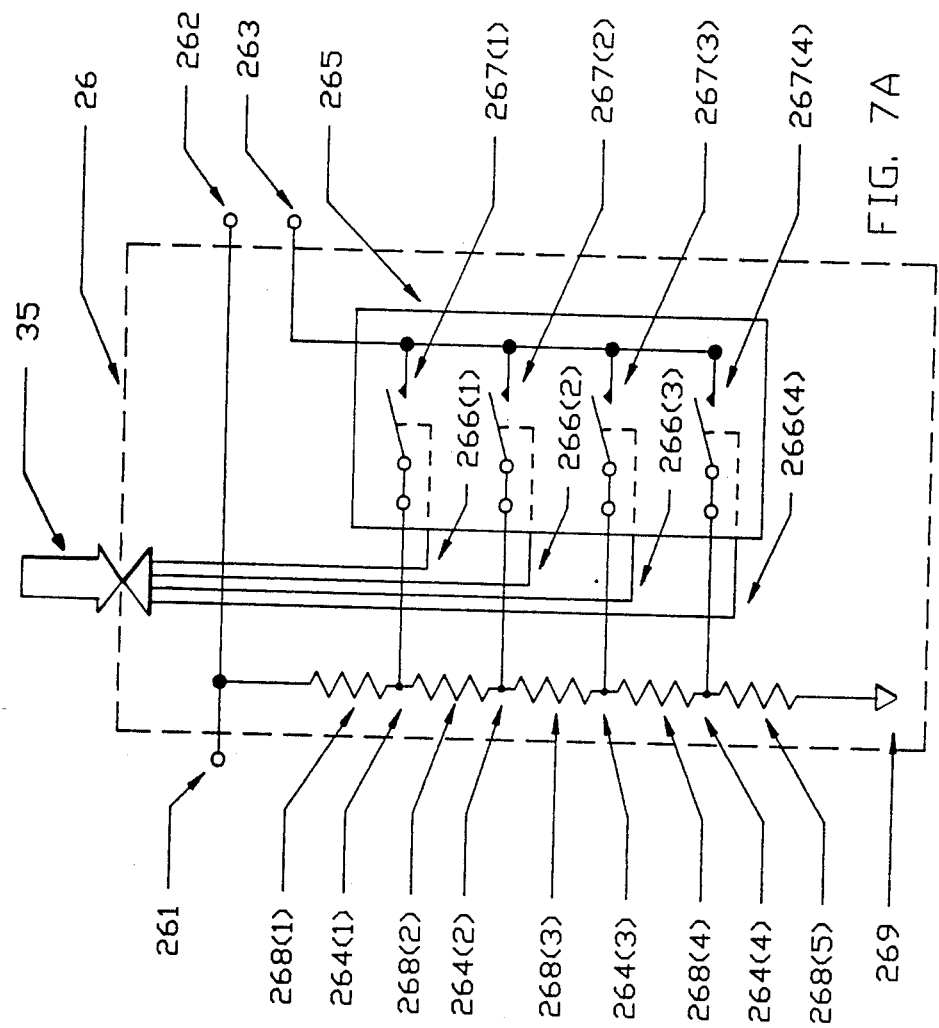
FIG. 7A is a schematic diagram of an exemplary Power Supply Module (PSM) shown in FIG. 7 for performing DC-to-DC conversion.

FIG. 7A is a simplified schematic diagram of an exemplary preferred PSM 26 embodiment used to accomplish the DC-to-DC conversion within the CPU socket 1 shown in FIG. 7. As previously stated herein, one of the novel features of the present invention is that the preferred embodiment supports a self-contained energy source and circuitry necessary for the conversion of light (photons) directly to electrical energy.

The photovoltaic array 11 directly converts received radiant light (photons) energy to electrical energy for direct use by the PSM 26 via the power bus 13. Current technology is capable of transducing light directly to a voltage/current of a given value. The preferred embodiment converts light via conventional photovoltaics to the maximum voltage/current(s) required by the CPU 30 and associated ASIC 3 circuitry. This voltage is presented to the input 261 of the PSM 26 as shown in FIG. 7A. Said voltage/current is directed, via metallic traces, to the output 262 of the PSM 26 for subsequent use by the ASIC 3 and its associated components.

PSM 26 includes a conventional CMOS solid state switch module 265, wholly contained within an IC socket, for digitally controlling multiple sources of output DC voltage for the use of said IC socket (in this case, the CPU socket 1). The solid state switch module 265 couples different voltages, developed across a conventional voltage divider 268(1)–268(5) (said voltage divider referenced from the input voltage 261 to ground 26B) to an output 263 source to be used to power the hosted IC 100.

The theory of operation of said voltage divider is conventional to one versed in the art. Voltages are developed in decreasing values, across resistors 268(1)–268(5), at the voltage nodes 264(1)–264(4). These incremental voltages are developed by advantageously designing CMOS resistor arrays with resistor values necessary to produce the voltages needed to power hosted TTL, ECL, DTL, RTL, CMOS, etc. devices. An exemplary voltage for a TTL device (5.5 Volts DC) developed at node 264(3), across resistors 268(1)–268(3), is present at the normally open contact of a solid state switch 267(3) contained within the CMOS solid state switch module 265.

The CPU 30 under program control (explained later) determines the type of power the hosted device 100 requires. In this case, by way of example, the TTL device might require 5.5 volts DC. The CPU 30, via address bus 35, places a logical high value on the CMOS control line 266(3) thereby closing the normally open switch 267(3) and placing 5.5 Volts DC on the hosted device output 263 and subsequent hosted device 100. In this manner, the preferred embodiment significantly elevates the art of socket design by providing a universal life-support capability to all commercially available IC devices that is a noise-free stable DC voltage. Thus the need for additional or excessive regulation, filtering, and decoupling is minimized or eliminated and parts count is reduced.

Different conductors of buses 35–38 are typically used for conducting different types of signals required by the hosted IC 100—depending upon mapping information corresponding to the hosted IC stored in EE-PROM 33.

The RISC 23 shown in FIG. 7 includes five major units in the preferred embodiment. These units are the system control coprocessor unit (SCCU) 28, the local control unit (LCU) 29, the central processing unit (CPU) 30, the instruction cache unit (ICU) 31, and the data cache unit (DCU) 32. Internal unit processing of instructions and data is handled via an address bus 35, a control bus 36, and a data bus 37. These three buses are also extended internally to support all other modules of the ASIC 3 as well as the hosted IC 100. The ASIC supports a fourth bus, the logic emulator bus 38, used to provide all necessary logic, enable(s), clocking and other synchronization signals and the like at voltage levels compatible to the hosted IC 100. In like manner, the PSM 26 supplies appropriate power to the socket 1 and hosted IC 100. The address bus 35 extends to the PSM 26 to provide the necessary control of the DC-to-DC converters 265.

The RISC 23 in the preferred embodiment supports several major conventional microcomputer features such as a full 32-bit operation (with associated 32-bit registers and necessary 32-bit instructions/addressing), on-chip cache control, on-chip memory management, coprocessor interface, multiple compiler support (capable of supporting C, Fortran, and Pascal compilers), multiple operating systems (capable of supporting UNIX TM, System V.3, and a further operating system hereinafter referred as RamOS), a high-speed CMOS technology, and high-speed clock rates supporting yields from 12 to 15 million instructions per second (MIPS) sustained throughput.

The RISC 23 in the preferred embodiment actually includes two processors capable of achieving performance standards normally available in large mainframe computer systems. The first processor is conventional full 32-bit CPU 30. The CPU 30 includes thirty-two general purpose 32-bit registers, a conventional 32-bit program counter, a conventional arithmetic logic unit, two conventional 32-bit registers that provide multiply/divide operations, a conventional address adder, and a conventional program counter increment/multiplexer—all of which are connected and interact together in an entirely conventional manner well known to those in this art. In the preferred embodiment, the typical function of a program status word register is not found in the CPU 30, rather it is allocated to the SCCU 28 to permit the CPU 30 to offload RISC 23 housekeeping functions and background ASIC 3 utilities (such as data/communication, LAN control, dynamic reallocation, etc.) in order to support high MIPS throughput rates.

The RISC 23 in the preferred embodiment is capable of multitasking and cache memory control because of a tightly-coupled second processor or dedicated coprocessor 28. Multitasking is an important capability in the preferred embodiment, since it permits several separate but interrelated tasks to operate under a single program identity. The coprocessor 28 is functionally dedicated in that its purpose is not for more traditional uses such as math coprocessing. The system control coprocessor unit (SCCU) 28 is dedicated to the higher level support processing tasks found in larger multitasking, multiprocessing computers such as background, kernel, and exception handling tasks. The SCCU 28 also contains conventional exception and control registers that allow for two basic operating modes, the user mode (foreground) and kernel mode (background), that support smooth operation of background chores as stated herein.

Multitasking is an important feature in supporting the various types of hosted IC's 100. This is also one of the many features of the CPU socket 1 that advances the state-of-the art beyond simple computer architectures, since each socket 1 becomes a fully functioning multitasking microcomputer capable of interacting on a host-to-host level with other sockets or hosted ICs (devices) 100 on said sockets 1. Such features as socket-to-socket communication, emulating logical high's and low's presented to the hosted IC 100, and socket addressing/commands are controlled in the background via the CPU 30. Upon detection of an exception, the SCCU 28 is forced into the kernel mode for proper handling of the exception. Finally, the local control unit (LCU) 29 supports the coupling of instructions between the SCCU 28, the CPU 30, and the master pipeline and bus control 36.

The RISC 23 preferably uses local, high-speed, cache memory. The RISC 23 uses the instruction cache unit (ICU) 31 and the data cache unit (DCU) 32 to hold instructions and data that are repetitively used in supporting communications through the FIFO 24 and background support provided the hosted IC 100. The RISC 23 can support either local or external cache memory in the preferred embodiment. The write buffer memory (WBM) 34 guarantees data consistency in a conventional manner. All data written to the DCU 32 must also be written to the main memory (in this example, main memory is the hosted IC 100). The WBM 34 captures this data and relieves the CPU 30 of this chore and thus increases the throughput of the system and maintains high pipeline efficiency. The WBM 34 ensures that accurate data is passed on to the hosted IC 100.

In the preferred embodiment, the SCCU 28 supports a virtual memory system implemented using a conventional translation lookaside buffer along with conventional programmable memories to provide a dual-cache bandwidth of up to 133 Mbytes/second. The SCCU 28 provides a conventional memory management system with an addressing range of 4 Gbytes. Said memory may be allocated and mapped into 2 Gbytes as a user mode virtual address space and 2 Gbytes as a kernel mode virtual address space—all in an entirely conventional manner. System speed is enhanced in the RISC 23 by the support of the translation lookaside buffer (contained in the SCCU 28) allowing extremely fast virtual memory access and is in consonance with the requirements of multitasking operating systems such as UNIX TM.

Virtual memory capabilities are important to support the high system processing speeds used to accomplish the various background tasks associated with socket-to-socket communication and PCB emulation in the preferred embodiment. It is the task of the virtual memory system to ensure that prior to executing an instruction, the instruction and its operand(s) are in main memory. If, on average, the instruction or group of instructions in the virtual memory and lookaside buffer were not available, then they must be located in secondary memory. If this secondary retrieval were continually done on a single instruction basis, the system overhead, execution, and throughput degradation would be significant. The details of such memory management need not be explained in any detail here, since they are entirely conventional and well known to those having only ordinary skill in this art.

The EEPROM 33 stores program control instructions implementing the basic operating system (e.g., RamOS), utilities, initial lookup tables, security features, and a limited user programmable (non-volatile) data storage area necessary for customizing user architectures. Advantageous use of the EEPROM 33 tables and utilities allows the designer to take full advantage of the novel features of static and dynamic allocation(s) of socket 1 processing resources as well as reallocating (dynamically) circuit topologies (typically this feature would be used in the event of host IC 100 failure to "work-around" the failure in a so-called "fail-soft" mode—as is known to those skilled in this art—or upon adding circuitry such as additional memory to the system). The system clock module (SCM) 25 provides all the system clocks necessary to drive the RISC 23, ASIC modules 24, 26, 17, 33, 34, and various counted down clock outputs (approximately 4.1) to support the hosted IC 100.

The SCM 25, under CPU 30 control, provides the necessary clock speeds to support a plurality of IC device 100 characteristics stored in the EEPROM 33. This conventional control of the system clock allows the RISC 23 to support various hosted IC(s) 100 timing requirements in the preferred embodiment.

The power supply module (PSM) 26 accepts the voltage/current developed from the transceiver power column 5 (shown in FIG. 2 and 3) and via programmable DC-to-DC converters 265 supplying all voltages necessary for the RISC 23, ASIC 3, and hosted IC 100. The logic emulator module (LEM) 27 in conjunction with the PSM 26 and program control provided by the RISC 23, by way of the address bus 35 and logic emulator bus 38, provides the necessary logic signals, control signals, and power voltages required by host IC 100 and applies these signals and voltages to the appropriate pins of the hosted IC 100. The PSM 26 and LEM 27 support any standard IC logic such as TTL, ECL, CMOS, etc. The LEM 27 also provides PCB emulation by applying appropriate logical high's and low's to the hosted IC 100 when commanded by the RISC 23. This allows the RISC 23 to emulate the control inputs to various hosted IC's 100 of different voltage logic levels as though the IC were connected to a conventional PCB. Synchronization is controlled by the RISC 23 and the SCM 25 in an entirely conventional manner known to those having only ordinary skill in this art.

Figure 7B:
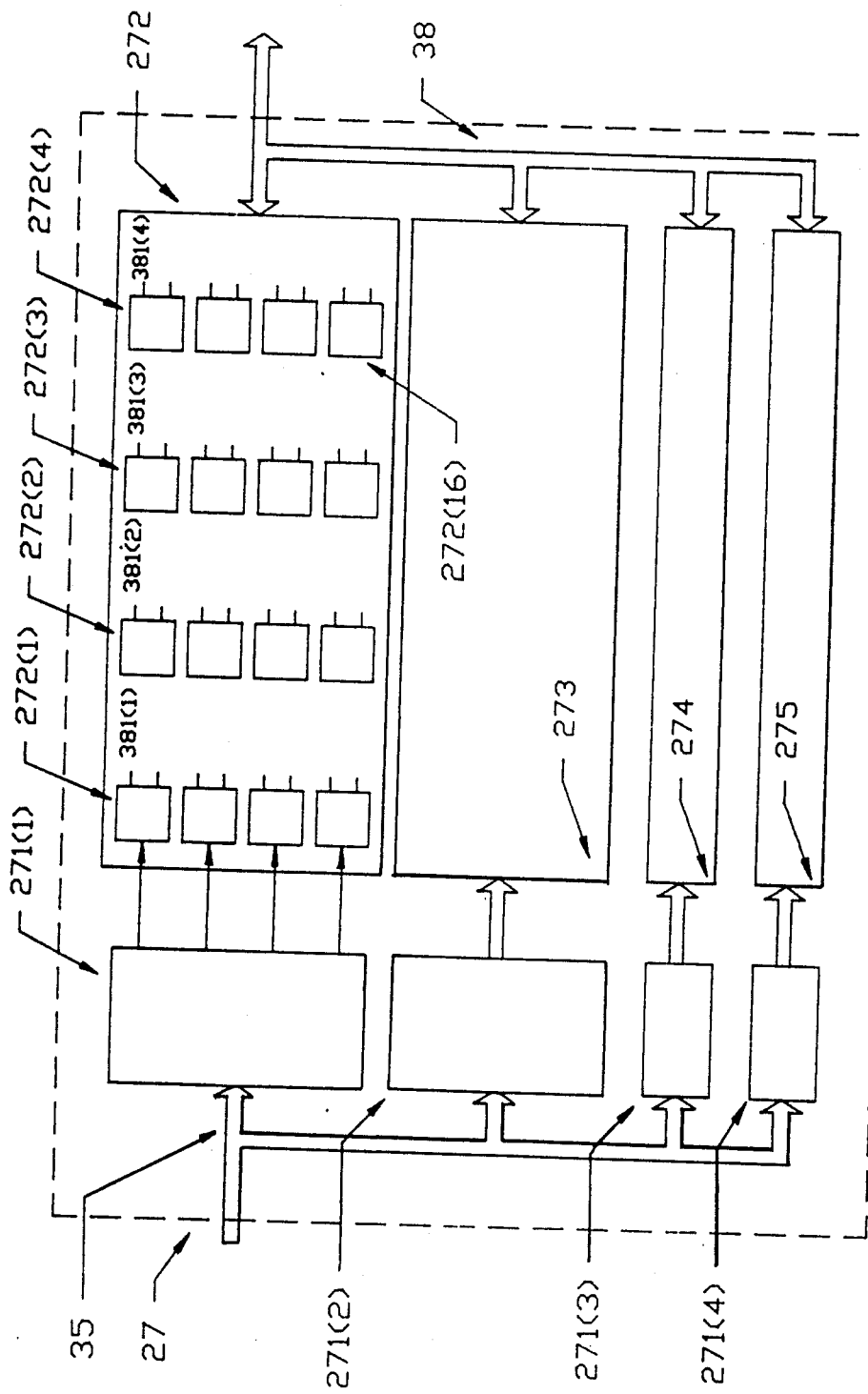
FIG. 7B is a schematic diagram of an exemplary Logic Emulator Module (LEM) shown in FIG. 7 for performing 64-pin IC emulation for example.

FIG. 7B is an exemplary simplified schematic block diagram showing the preferred embodiment of the logic emulator module (LEM) 27 shown in FIG. 7 (by way of example, a method of emulating a 64-pin hosted IC device 100 is depicted). As previously stated herein, one of the unique functions of the CPU socket 1 that significantly advances the various arts of IC socket design as well as PCB design is the ability of the CPU socket 1 to emulate the functionality provided by metallic traces on conventional printed circuit boards and thus obviate their need or the use of conventional PCB's. Sockets may be placed or embedded upon or within any physical medium or structure (rigid or flexible) that provides for the mechanical support of said CPU socket 1, easy insertion/extraction of said hosted IC device 100, and direct line-of-sight of the transceiver columns 5A-5D (for the purpose of communication from socket-to-socket) whether that line-of-sight is facilitated by a transparent medium such as plastic, clear epoxy, gaseous materials, liquids, fiber optic material(s), etc. This places the burden upon the CPU socket 1 to support all the electrical/physical interfaces and control circuit paths that would normally exist in a more conventional design or prior art PCB or IC component layout.

The LEM 27, employing conventional CMOS technology, in concert with the RISC 23 provides the vital background electrical interface suppport necessary to emulate the logical highs and lows placed upon various pins of an IC device were it in a more conventional circuit. By way of an example, the LEM 27 shows the 64 JK flip-flops arranged in an array capable of placing a digital high/low upon each of 64 pins of a hosted IC 100 (the array would increase by multiples of 16 flip-flops for additional hosted IC device pins over 64).

The RISC 23 may given a background control command or require a high to be placed upon a given pin of the hosted IC 100. It is assumed (by way of an example) that the RISC 23 needs to place a high on pin 6 of an exemplary 64-pin device such as a 16×6-bit parallel CMOS multiplier (typical of a conventional IC device part no. IDT7216L manufactured by Integrated Device Technology, Inc.) hosted IC 100. The exemplary pin 6 of the hosted IC 100 is designated as a three-state enable (OEL) and is to be set high for a specified number of clock cycles.

The preferred embodiment shown in FIG. 7B would process the said exemplary enable by placing a logical "1" (high) on an appropriate line (metallic trace) of the address bus 35. Said logical high would, in turn, drive a conventional 4-to-16 channel demux (demultiplexer) 271(1) (one of four exemplary demuxes 271(1)-271(4)). The proper output of the demux 271(1) would be coupled to the input (enable) of a conventional bistable JK flip-flop 272(6) (one of sixteen exemplary JK flip-flops 272(1)-272(16)) thus driving said JK flip-flop's 272(6) output (Q) high 381(6). This condition would be maintained by the JK 381(6) for the requisite number of clock cycles or until the CPU 30 changes (resets) the JK 381(6) status. The JK output (Q) high 381(6) is coupled via a metallic trace and diode ORed to the logic emulator bus 38. The logic emulator bus 38 couples the high to the metallic trace 7A (shown on FIG. 3) connected directly to the hosted IC 100 pin six 8(6). In like manner, all 64 pins of the exemplary hosted IC 100 are serviced by one of four demuxes 271(1)-271(4), driving one of four JK arrays 272,273,274,275, of which each array contains one of sixteen JK flip-flops ranging from 381(1)-381(64). It is also possible, via socket-to-socket communications for a hosted device, such as a CPU, for one socket to send an enable (via optical path) to a device, such as said parallel multiplier without the use of conventional PCB metallic traces.

Figure 8:
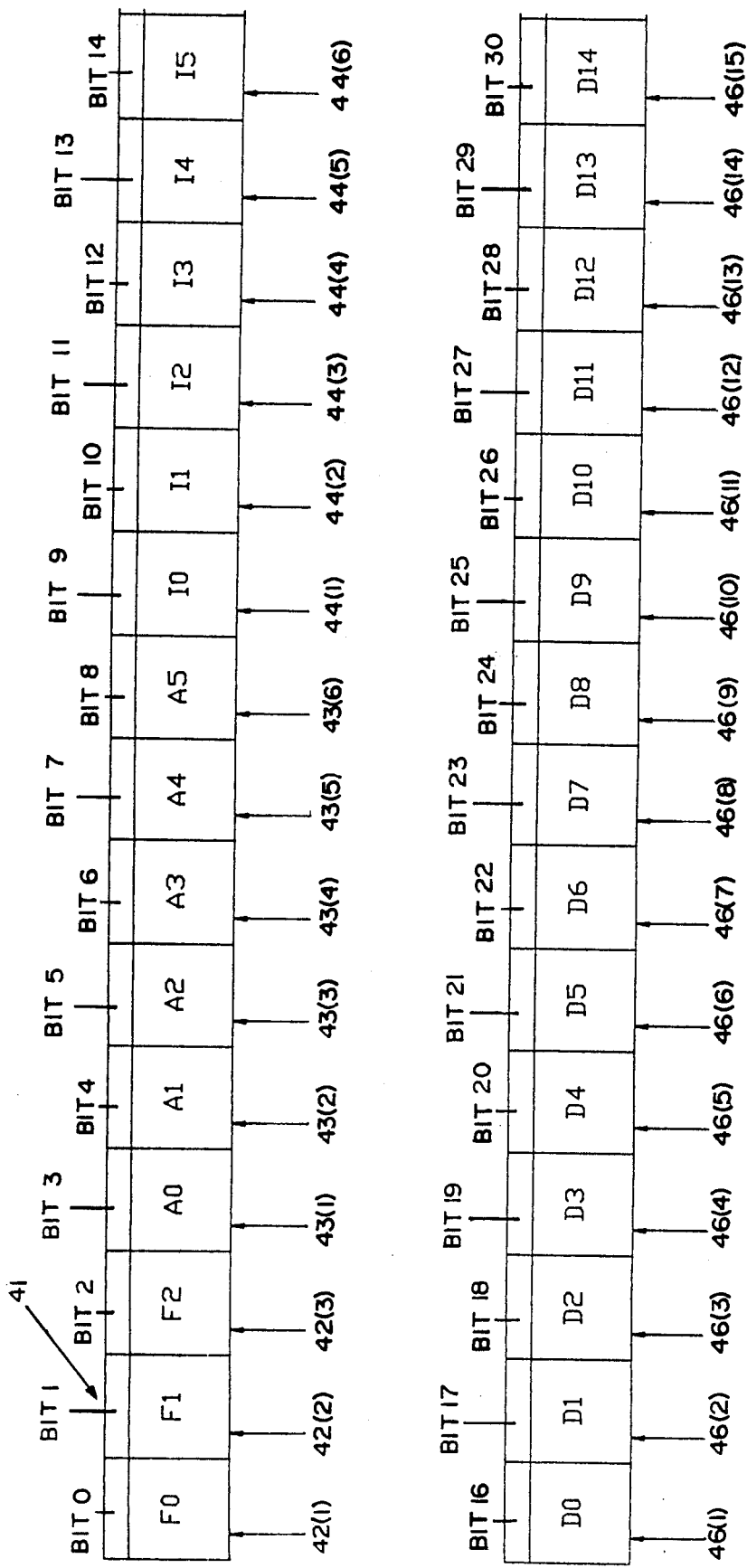
FIG. 8 is a schematic diagram of a frame sequence and bit definition for data communications between FIG. 1 sockets.

The RISC 23 and associated LSI modules are dedicated to supporting system requirements of CPU socket-to-socket communication via a dedicated digital signal bus hereafter referred as RamBus. FIG. 8 shows an exemplary frame sequence and bit definition diagram of RamBus. All data, commands, and addressing required by the CPU socket 1 are controlled by the RISC 23 and implemented by the protocol 41 shown in FIG. 8. The basic frame structure of the RamBus protocol 41 (shown in FIG. 8) includes two single 16-bit words (four bytes), excluding typical start bits, stop bits, parity bits, and error checking bits.

There are five basic bit fields contained within the protocol 41. They are the family field 42 bits ($F_0$ through $F_2$), the socket address field 43 bits ($A_0$ through $A_5$), the control field 44 bits ($I_0$ through $I_5$), the extension 45 bit, and the data field 46 bits ($D_0$ through $D_{15}$)

The family field 42 in combination with the address field 43 allows the RISC 23 to address a wide range of devices and sockets. The three bits contained within the family field 42 allow the RISC 23 to quickly identify all hosted IC 100 devices as one of four major family types. These may be generic families such as memory, CPU's/coprocessors, input/output, and miscellaneous devices. The bit $F_2$ is reserved for any family group of memory in the preferred embodiment. Exemplary bit patterns for the families are as shown below:

| | | |
|---|---|---|
| CPU/coprocessor | $F_0=1, F_1=0, F_2=0$ | (100) |
| I/O | $F_0=0, F_1=1, F_2=0$ | (010) |
| Misc | $F_0=1, F_1=1, F_2=0$ | (110) |
| Memory | $F_0=x, F_1=x, F_2=1$ | (xx1) | where "x"s indicate bit positions significant to a memory bank address when $F_2=1$. Exemplary subfamily fields are shown below:

| | | |
|---|---|---|
| Memory Bank 1 | $F_0=0, F_1=0, F_2=1$ | (001) |
| Memory Bank 2 | $F_0=1, F_1=0, F_2=1$ | (101) |
| Memory Bank 3 | $F_0=0, F_1=1, F_2=1$ | (011) |
| Memory Bank 4 | $F_0=1, F_1=1, F_2=1$ | (111) |

The address field 43 allows the RISC 23 to address up to sixty-four unique CPU sockets 1 in each of four generic families of hosted IC's 100 in the preferred embodiment. In similar fashion, the control field 44 (I field) allows each family to support sixty-four instructions in the form of controls, system commands, instructions, communication instructions, error handling commands, etc.

The extension bit 45 is used to control the use of the data field 46 in the preferred embodiment. If the extension bit 45 is high, then the additional 16-bit frame of the data field 46 is transmitted. In this way, the RamBus protocol 41 may transmit all required messages of address, data, and control thereby effectively emulating conventional address, data, and control on metallic buses of current PCB technology.

Figure 9:
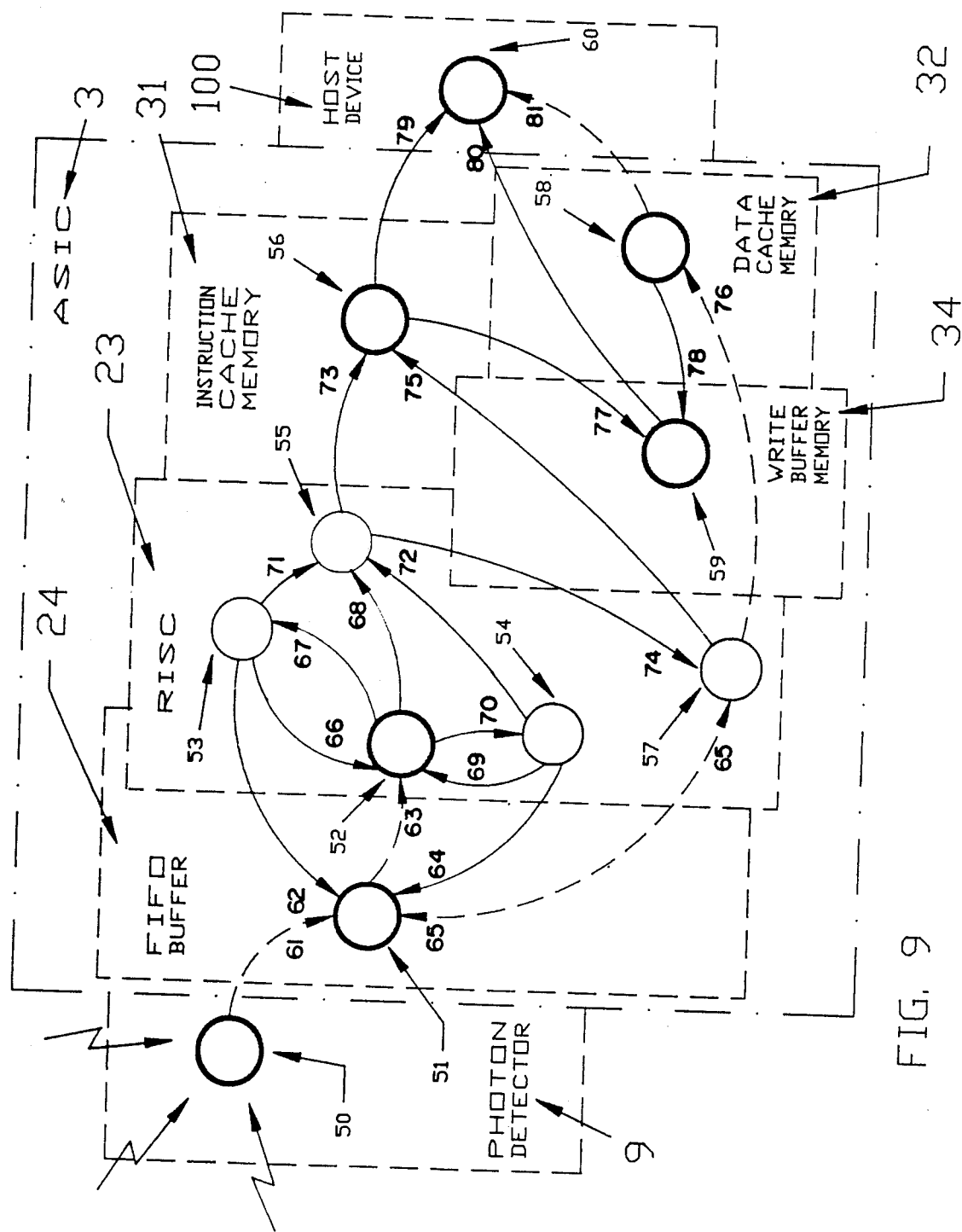
FIG. 9 is a functional logic diagram of exemplary functions performed in the preferred embodiment to accomplish a typical high level write to memory from a FIG. 1 socket hosting a CPU to a FIG. 1 socket hosting memory.

FIG. 9 shows the functional logic diagram of exemplary high level logic employed in CPU socket 1 and shows by way of example the exemplary logic and functional signal flow that would occur assuming a write-to-memory transaction for a CPU socket hosting a microprocessor such as an Intel 80286 to a CPU socket 1 hosting IC memory. While FIG. 9 is specifically directed to a write-to-memory transaction, all logic functions, message transfers, and interactions occur in a similar fashion for CPU-to-CPU, CPU-to-memory, or CPU-to-coprocessor data requests in the preferred embodiment. All socket-to-socket communication is via the protocol described herein and shown in FIG. 8 and transmitted via a light (photon) medium as a series of pulses representing binary signals. FIG. 9 shows this process as a high level depiction of a write to memory assuming proper data, address, and control information is being optically transmitted via RamBus intersocket and intrasocket communication protocol 41.

FIG. 9 shows logical functions implemented in hardware or firmware as hardware configuration items (HWCI) and graphically depicted as bold heavy circles (50, 51, 52, 56, 58, 59 and 60). Logical functions that are implemented via programs, machine language statements, or executable code (program control steps) as software configuration items (SWCI) are shown as thin circles (53, 54, 55 and 57). All logic function circles are connected via appropriately numbered arrows depicting physical or logical connectivity within the CPU socket 1 and its associated modules (such as the ASIC 3) implemented in etching and traces such as address, data or control busses or program transfer control statements.

A typical message transmitted from a remote CPU socket 1 arrives at the receiver (photon detector) panel 9, as shown in FIG. 5, as a serial asynchronous data string represented by pulses of light (photons). The basic "packet" of serial information received at the receiver 9 includes the framing and error detection pulses plus the data grouped as shown in the frame sequence depicted in FIG. 8. The photon detector 9 converts received pulses of infrared light into corresponding pulses (binary) of electrical voltage/current and transfers asynchronous (electrical signal) data frames to the ASIC 3 modules via internal metallic traces 61 (see receive bus 15 in FIG. 6 and FIG. 9).

The first ASIC 3 module to actually process the input data in the preferred embodiment is the FIFO module 24. The FIFO module 24 contains several conventional CMOS type FIFO buffers that support a plurality of conventional communications interface functions (such as buffering, transmitting and receiving data, serial-to-parallel conversions, and processing of asynchronous data for further use by the RISC 23). FIFO module 24 also facilitates processor-to-processor and processor-to-peripheral communications, mixes and matches various bus widths, LAN control, and performs parity checks—all in a conventional manner known to those having ordinary skill in this art. The input frame buffer 51 then queues up input messages back-to-back in a conventional $1K \times 18$-bit and $2K \times 9$-bit FIFO organization.

Program timing is controlled by the RISC 23. After the FIFO frame buffer 51 has received the complete message and performed parity checks, the RISC 23 clocks the 16-bit word into its internal input register 52 via input data lines 63. At this point, the RISC 23 is ready to perform conventional bit manipulation and decoding of the 16-bit word. Certain major portions of the framed message (shown in FIG. 8) are decoded in parallel in a conventional manner to increase the message throughput and support high overall processor speeds. Since in the preferred embodiment basic socket-to-socket communications are processed using techniques similar to those found in a conventional asynchronous LAN protocol, any given message received into the input register 52 may or may not be for that given CPU socket 1 as determined by its specific logical address. It is therefore important to the overall system throughput and socket performance that the RISC 23 perform parallel processing to decode the major elements of the data word—namely the address fields, the family fields, and the instruction or control fields (I field).

It is important that the RISC 23 simultaneously decode frame bits $A_0$–$A_5$ and $F_0$–$F_2$ for proper address and device type. Information relating to system addresses, device types, and circuit topology is preferably stored in EEPROM 33 and mapped into the RISC 23 upon initial cold boot of the CPU socket 1. The appropriate address bits ($A_0$–$A_5$) from the input register 52 are transferred, under program control 70, to the SWCI address decode module 54. At the same time, via the before-mentioned RISC 23 pipeline instructions, the appropriate family device bits (F₀–F₂) are transferred under program control 67 to the SWCI family device decoder 53. Allowable system and device instructions and program control instructions (I₀–I₅) are sent via program control 68 to the SWCI instruction decoder 55. In the preferred embodiment, the RISC 23 does not waste time decoding I₀–I₅ until it has been determined in the address module 54 that the message is intended for this particular CPU socket 1.

Both the address decoder 54 and the device decoder 53 have the ability to clear and reset the instruction decoder 55 via reset controls 72 and 71 respectively upon finding an improper address or device type. The RISC 23 then supports the address decoder 54 in incrementing the FIFO input buffer 51 via an increment offset command 64. The device decoder 53 also has the capability to increment flags in the FIFO input queues 51 via its increment offset 62 in a conventional manner.

Upon receiving a properly addressed message for the appropriate device type (in this example hosted memory), the instruction decoder 55 decodes the proper message which may indicate background program controls to be executed or other messages/data to be clocked into the RISC 23 registers. The RISC 23 via the instruction decoder 55 transfers all valid instructions received to the instruction cache 56 (contained within the instruction cache unit 31) via instruction/control lines 73. Maintaining a cache of instructions significantly increases system speed by not requiring slow instruction fetches from main memory.

Since the description given herein is for a typical write-to-memory transaction, eventually the background instructions and control will be decoded, executed, and lead up to a word containing a high bit in the "x" field. The instruction decoder 55 will then transfer the x-bit to the x field decoder 57 via program control 74. Upon decoding a high bit (signifying data is to follow in the next 16-bit word), the x field decoder 57 notifies the FIFO input buffer 51 to increment the offset in order that the RISC 23 may clock in the next full 16-bit word containing the data (D₀–D₁₅) field. This 16-bit word is brought in over the data lines 65 to the x field decoder 57. The data is then transferred to the data cache 58 contained within the data cache unit 32 via data lines 76.

The RISC 23 alternates the processor access between the instruction cache unit 31 and the data cache unit 32 during each CPU cycle. Thus, the processor may obtain data and instructions at the cycle rate of the CPU. In the write-to-memory example, the appropriate memory address is stored in the instruction cache 56 and transferred to the host memory IC 60 in order to set up the proper memory address location via the address lines 79. Data is transferred from the data cache 58 to main memory 60 via the data lines 81. To insure data integrity and improve system performance, all data that is written to the data cache 58 is also written out to main memory 60 via the write buffer 59 and associated data lines 78, 80. To relieve the RISC 23 CPU of this responsibility (and the inherent performance and overhead burden), the RISC 23 supports an interface 77, 78 to the write buffer 59. The write buffer 59 captures data and associated addresses (via respective lines 77, 78) output by the CPU 30 and ensures data is accurately transferred to main memory 60 via data and address lines 80.

Figure 10:
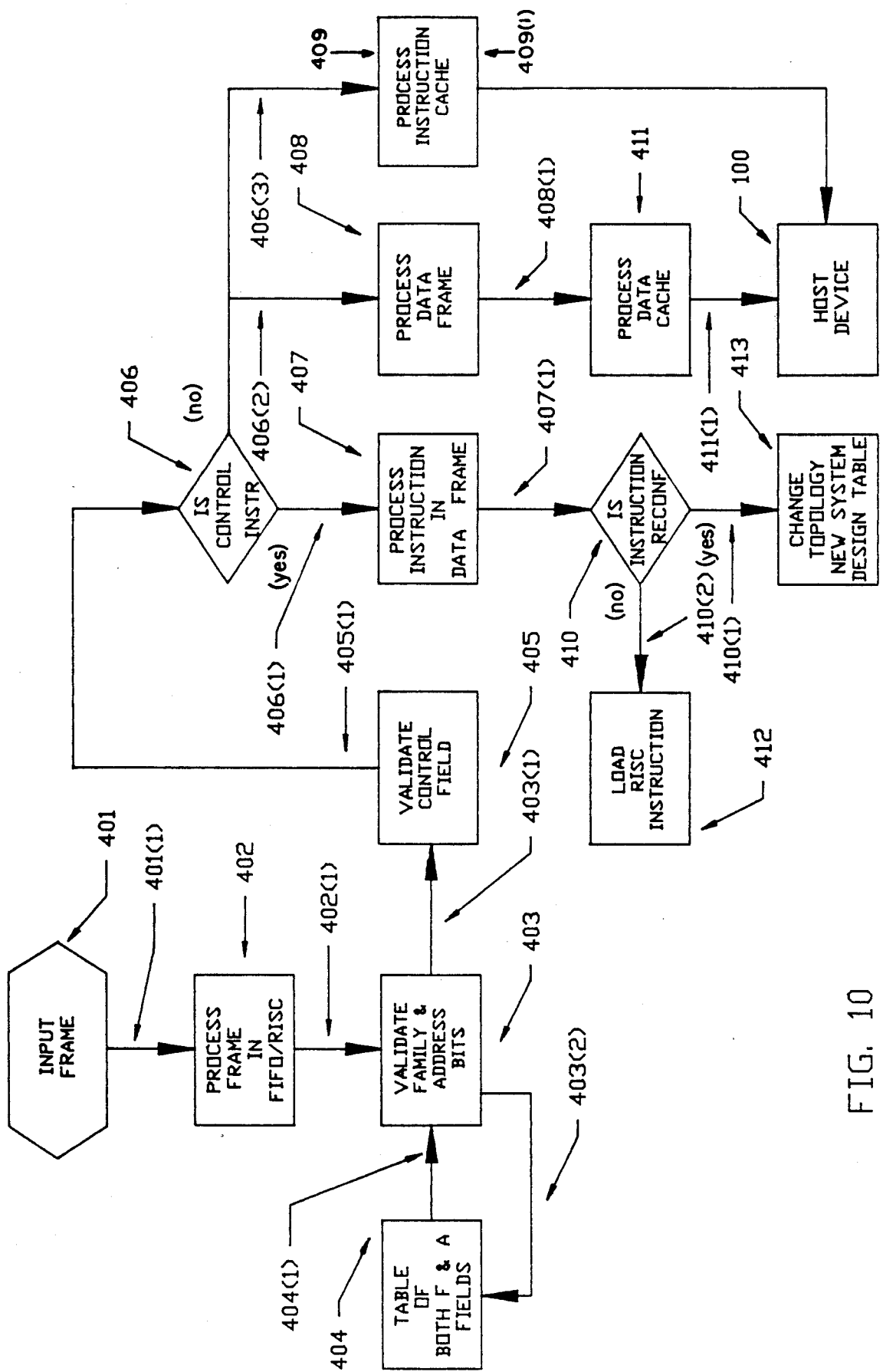
FIG. 10 is a schematic flowchart of exemplary program control steps performed by the processors within the FIG. 1 socket for accomplishing a typical high-level write-to-memory in accordance with the functional logic detailed in FIG. 9.

FIG. 10 is a schematic flowchart of exemplary program control steps performed by the processors within the FIG. 1 socket while accomplishing an exemplary high level write-to-memory in accordance with the functional logic diagram of FIG. 9. The present invention exemplary embodiment significantly advances the art of socket and PCB design made possible, in part, by a novel, advantageous application of software and firmware. Many of the exemplary features and applications in accordance with the present invention are provided by exemplary programming control instructions residing in read-only-memory (ROM) found in the preferred embodiment of the EEPROM 33. Additionally, random-access-memory (RAM) is available for program use in the DCU 32 or even selected portions of hosted IC memory 100 may be shared and used. Said EEPROM 33 stores within itself (nonvolatile memory) various key tables, in the form of a relational database, that allows the ASIC 3 (and previously described exemplary RISCs 23 contained within the preferred embodiment of the current invention) to perform the functions of PCB circuit emulation, socket-to-socket comuunication, etc.

The significant features and functionality of the CPU socket 1 are supported in the novel use of various lookup tables such as the IC configuration table, family tables, address tables, topology configuration table, and application/control tables. The advantageous application of said tables and firmware allow the novel software applications to perform background functions of socket-to-socket communication, socket-to-hosted IC communication, message addressing and framing, and a plurality of control commands necessary for the direct support and management of shell commands (used by hosted ICs 100 communicating with other hosted ICs 100) and kernel commands (used by the CPU socket 1 for internal use as well as socket-to-host IC commands necessary for proper hosted IC 100 operation such as would be provided for in a more conventional mounting of an IC device on a PCB and managed by a conventional operating system). The exemplary background kernel commands would be those necessary to provide CPU socket 1 control (managed by RamOS) as well as host IC 100 controls including a plurality of commands necessary to emulate the electrical interface provided by a conventional PCB and manage the services required by a hosted IC 100 such as system clocks, enables, disables, sets, resets, data, address information, etc.

The background emulation capability is previously described in the present invention in the preferred embodiment of the LEM 27. The software, firmware, and utilities that manage the LEM 27 and provide internal background control as well as overall socket control reside within the EEPROM 33 and read into RAM cache memory 32 (or exemplary hosted IC 100 as necessary) at the point of initial system start-up ("cold boot") and ultimately managed under the executive program (RamOS controlled by processors contained within the RISC 23) operating system control. The plurality of utilities, control commands, lookup tables, and overall system operation may be managed by any one of several operating systems (RamOS, UNIX TM, System V.3, etc.). The operating system is also contained within the EEPROM 33 and activated in a conventional manner at a time of initial socket 1 powerup. Each CPU socket 1 in the preferred embodiment contains its own independent operating system—allowing said socket 1 to operate as a fully functional microcomputer. Several sockets 1 within a given system design interact as a distributed processing system capable of multitasking and sharing distributed memory typical of a multicluster multiprocessor architecture currently found only in large computer systems, such as might be found in various types of "hypercube" multiprocessors (refer to the article referenced in IEEE Transactions on Software Engineering, Vol. 15, No. 3., March 1989).

Prior to initial use/operation of CPU socket 1, the systems user/designer must store basic information into the EEPROM 33 needed by the CPU socket 1 to perform properly within a given system design or circuit topology. This stored informatoin is in addition to certain basic information ("knowledge") stored within each CPU socket 1 necessary for said socket 1 to function properly as a stand-alone microprocessor. Each CPU socket 1 has stored within the EEPROM 33 the "knowledge" of the physical and electrical requirements of a plurality of commonly used and commercially available IC devices that might find end-user application as a hosted IC 100. The system user/designer may additionally program (load into the EEPROM 33 firmware) each CPU socket 1 with the necessary data to support a unique (not commercially or commonly available) hosted IC 100 to be used in conjunction with said CPU socket 1 allowing a certain degree of customization of IC devices 100 that may be used with said socket 1.

The preferred embodiment of the EEPROM 33, as stated previously herein, stores basic information about various IC devices. This information includes knowledge of said hosted IC's 100 pin configuration (pin configuration table), said IC's 100 family type (family table, i.e. if said device is memory, CPU, I/0, coprocessor, etc.), generic or preferred device address (address tables store a preferred family address for each family type, however the preferred embodiment allows the system user/designer to customize or store specific multiple addresses in the event that a system design would employ many devices of a given family such as several CPUs to be hosted upon several CPU sockets 1), and said hosted IC's 100 control/commands (application/control table) that are necessary for the proper operation and support of said hosted IC 100 devices.

The information that is not previously stored in each EEPROM 33 of the preferred exemplary embodiment is the system device topology. Most conventional schematics or systems employing IC technology may be converted to use the present invention (employing CPU socket 1 technology). As is currently true with the art of system design, is also apparent with CPU socket 1 technology, namely the schematic or functional layout of a given system/design must first be performed by the designer and proven to work (proof-of-concept). After a viable proof-of-concept design is properly functioning, then CPU socket 1 technology may be used to obviate the next step of implementing the user's system design in PCB technology, or the CPU socket 1 may be used to supplement or simplify existing PCB layouts. This requires, however, that the preferred embodiment be supplied (i.e., by loading information into the EEPROM 33) the proper system topology, to include the proper unique address information (if any other than the defaulted generic addresses), IC family types used, device (hosted IC 100) power requirements (such as TTL, ECL, CMOS, etc), and inter-device communication requirements. All of said requirements are provided in the form of a stored topology table prior to CPU socket 1 and subsequent hosted IC 100 device activation. In this way, the RISC 23 may manage the relational database (in conventional manner) to support the ASIC 3 in the total emulation of a conventional system circuit design.

The top level software flowchart shown in FIG. 10 is initiated after initial cold-boot of the CPU socket 1. Once the RISC 23 has had time to load the appropriate operating system, perform background checks, and performed diagnostics of the ASIC 3 contained within the CPU socket 1, load the necessary tables described herein, and clear and set all registers for initial operation, said RISC commences a cyclic process of kernel operation of a preferred method of operational program flow. Said exemplary processes are performed continually with or without the presence of a hosted IC 100 device.

An exemplary write-to-memory starts by the operating system (by way of example, RamOS) loading in a single fully framed 401 message that has been received (asynchronously) by the photon detector 9 (the receiver/detector module 50 shown in FIG. 9) and stored in the FIFO buffer 51 awaiting processing. The single framed word (including start bits, error checking, and stop bits) is loaded into the RISC 23 register from the FIFO buffer 51 via software program control as a load register command 401(1). The communications link layer services (in accordance with the OSI model) provided by the RISC 23 strips the message framing pulses and performs error checking and error correction as the primary processing 402 of each framed word queued up in the FIFO buffer 51. Once a received word is processed 402 at the link level and found appropriate, said word is transferred (402(1)) to program modules that validate the various bit fields 403 of said word.

The RISC 23 preferrably advantageously optimizes the conventional use of cache memory 32 and pipelining to increase system speed and throughput. This is performed as parallel tasks that validate the family bits 42 and address bits 43. The validation (of the family bits 42 and address bits 43) family module 403 passes control to 403(2) and from (404(1)) a plurality of lookup tables 404 in order to rapidly assess if said message (data word) is for said exemplary CPU socket 1 and exemplary hosted IC 100 memory.

Upon confirming a given message is properly received (correct address 43) and of proper family (correct family code 42, in the exemplary case of hosted IC 100 memory), the RISC 23 proceeds to disassemble, decode and validate the control field 405 (control field bits 44). Control messages contained within the I-field 44 may be of two basic varieties in the preferred embodiment. The exemplary control messages are those required in the background (kernel) to support the CPU socket 1 functions and applications such as LAN control, socket-to-socket communication, preconditioning of socket pins 8, and circuit topology emulation, etc. These commands may be generated and executed either statically (at time of cold-boot) to configure the PSU 26 or dynamically ("on the fly") as necesary to reconfigure the LEM 27. The second general type of control message passed from socket-to-socket is a foreground (shell) message typical of a hosted device 100, such as a CPU, sending control, address, or data information to another hosted device 100, such as memory, coprocessors, other CPUs, etc. Since any word may be of either of the two basic types, the software separates the messages 406 into the various exemplary type described herein.

Background instructions (controls) are processed according to whether they are process or configuration commands (407), foreground data (408), or foreground instructions (409) (including control and/or address instructions). The conventional messages of a hosted CPU 100 transmitted to a hosted memory 100 finally are used to perform the required sets, enables, etc. in preparing (at 409(1)) the exemplary hosted memory 100 to accept the conventional data word that is processed (in conventional manner to one versed in said technology) within a few clock cycles after being enabled and having the address lines present. The data bits 46 are decoded 408 and stored in data cache (411) prior to ultimately being loaded (conventionally understood by those familiar with data management techniques) into the host device 100. The background instructions are processed 407 and separated 410 as to RISC 23 and configuration/topology commands 413 such as those to set the PSU 26 and/or LEM 27.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

We claim:

1. An integrated circuit socket for receiving an integrated circuit device having electrical data signal protocol requirements associated therewith, said integrated circuit device including plural electrically conductive pin connections for accepting electrical signals conforming to said data signal protocol, said socket including:
   a socket body;
   electrical connecting means within said socket body for electrically connecting with the conductive pins of said integrated circuit device;
   communicating means for communicating signals between said socket body and an external device in a further protocol different from said electrical data signal protocol; and
   active circuit means, within said socket body and operatively connected between said electrical connecting means and said communicating means, for translating signals corresponding to said further protocol received from said external device to said electrical data signal protocol required by said integrated circuit device and for translating electrical signals produced at said electrically conductive pin connections in said electrical data signal protocol by said integrated circuit device to said further protocol for transmission to said external device.

2. A socket as in claim 1 wherein said communicating means includes:
   optical transmitting means for converting electrical signals provided by said active circuit means to first optical signals and for transmitting said first optical signals to said external device in said further protocol; and
   optical receiving means for receiving further optical signals transmitted by said external device and for converting said further optical signals to electrical signals in said electrical data signal protocol, said optical receiving means including signal storage elements storing and providing signal levels to said integrated circuit for duration required by said integrated circuit.

3. A socket as in claim 2 wherein:
   said socket further includes power distributing means connected to said first connecting means and to said active circuit means for applying electrical power signals to said active circuit means and to said integrated circuit device; and
   photovoltaic array means connected to said power distributing means for receiving optical energy and for converting said received optical energy to said electrical power signals.

4. A socket as in claim 1 wherein said further connection means included programmable electrical signal level converting means connected to said active circuit means for translating signals received from said external device to predetermined electrical signal levels required by said integrated circuit device, said programmable converting means being capable of alternately delivering different electrical signal levels to different integrated circuit devices.

5. A socket as in claim 1 wherein said communicating means comprises a column extending from said body, said column including:
   means for defining plural exterior surfaces;
   optical transmitting means disposed on at least one of said surfaces for transmitting data-encoded light pulses to said external device; and optical receiving means disposed on at least another of said surfaces for receiving data-encoded light pulses from said external device.

6. A socket as in claim 5 wherein said transmitting means includes spherical lens means for distributing said light.

7. A socket as in claim 1 wherein said further connecting means comprises a column extending from said body, said column including:
   means for defining plural exterior planar surfaces;
   optical receiving means disposed on at least one of said planar surfaces for receiving data-encoded light pulses, for converting said light pulses to electrical data pulses, and for applying said electrical data pulses to said active circuit means; and
   further optical receiving means disposed on at least another of said surfaces for receiving light energy, for converting said received light energy into power supply electrical current, and for applying said power supply electrical current to power said active circuit means and via said first connecting means to power said integrated circuit device.

8. An integrated circuit socket for receiving an integrated circuit device having signal requirements associated therewith, said integrated circuit device including plural electrically conductive pin connections, said socket comprising:
   a socket body;
   electrical connecting means within said body for electrically connecting with the conductive pins of said integrated circuit device;
   communicating means for communicating data between said socket body and an external device; and
   active circuit means within said socket body and electrically connected between said electrical connecting means and said communicating means for translating data received from said external device to said signals required by said integrated circuit device and for translating data produced by said integrated circuit device for transmission to said external device, wherein said further connection means includes programmable electrical signal level converting means connected to said active circuit means for translating signals received from said external device to electrical signal levels required by said integrated circuit device, and wherein:

said active circuit means includes memory means for storing signal level characteristics corresponding to said integrated circuit device; and said programmable converting means includes means for adjusting said electrical signal levels in response to said stored signal level characteristics.

9. An integrated circuit socket for receiving any one of plural standard integrated circuit device having particular standard signal requirements associated therewith, said plural standard integrated circuit devices having different electrical signal protocols associated therewith, said received integrated circuit device including plural electrically conductive pin connections, said socket comprising:

a socket body;

plural electrical pin connecting means defined within said socket body for electrically connecting with corresponding plural conductive pins of any one of said plural integrated circuit devices;

communicating means for communicating data between said socket body and an external device, said communicating means including means for transceiving data in a generic protocol, said generic protocol being independent of the received integrated circuit device; and active circuit means within said socket body and electrically connected between said electrical connecting means and said communicating means for translating data received from said generic protocol to said protocol associated with said specific received integrated circuit device and for translating data produced by said received integrated circuit device in said protocol associated therewith to said generic protocol for transmission to said external device.

10. A socket as in claim 9 wherein said communicating means includes optical transceiving means for transmitting and receiving optical signals from said external device.

11. An integrated circuit socket for receiving any one of plural standard integrated circuit device having particular standard signal requirements associated therewith, said received integrated circuit device including plural electrically conductive pin connections, said socket comprising:

a socket body;

plural electrical pin connecting means defined within said body for electrically connecting with corresponding plural conductive pins of said received integrated circuit device;

communicating means for communicating data between said socket body and an external device, said communicating means including means for transceiving data in a generic protocol, said generic protocol being independent of the received integrated circuit device; and active circuit means within said socket body and electrically connected between said electrical connecting means and said communicating means for translating data received from said generic protocol to said signals required by said received integrated circuit device and for translating data produced by said received integrated circuit device to said generic protocol for transmission to said external device, wherein:

said active circuit means includes:

means for storing signal characteristic parameters corresponding to each of said plural integrated circuit devices, and means for selecting the parameters corresponding to said received integrated circuit device from said stored characteristic parameters; and said translating means includes emulating means for providing an emulated electrical signal interface to said received integrated circuit device in response to said selected stored parameters and further in response to signals received from said external device.

12. A socket as in claim 11 wherein:

said storing means includes means for storing signal level parameters corresponding to said received integrated circuit device, said stored signal level parameters defining signal levels; and said emulating means includes DC-to-DC converter means for converting to and from said signal levels defined by said stored signal level parameters.

13. A socket as in claim 11 wherein:

said storing means includes means for storing timing signal parameters corresponding to said received integrated circuit device; and said emulating means includes means for generating timing signals required by said received integrated circuit device in response to said stored timing signal parameters.

14. A socket as in claim 11 wherein:

said socket is adapted for operative connection to plural integrated circuit devices connected in a circuit topology; and said active circuit means includes means for storing data specifying said circuit topology so as to allow said socket to easily dynamically adapt to different circuit topologies.

15. An integrated circuit socket for receiving any one of plural standard integrated circuit device having particular standard signal requirements associated therewith, said received integrated circuit device including plural electrically conductive pin connections, said socket comprising:

a socket body;

plural electrical pin connecting means defined within said body for electrically connecting with corresponding plural conductive pins of said received integrated circuit device;

communicating means for communicating data between said socket body and an external device, said communicating means including means for transceiving data in a generic protocol, said generic protocol being independent of the received integrated circuit device; and active circuit means within said socket body and electrically connected between said electrical connecting means and said communicating means for translating data received from said generic protocol to said signals required by said received integrated circuit device and for translating data produced by said received integrated circuit device to said generic protocol for transmission to said external device wherein said communicating means includes:

means for assigning an address to said socket;

means for receiving data together with an intended destination address associated therewith; and means connected to said address assigning means for discriminating between received data intended for said socket and received data intended for a destination other than said socket in response to said assigned address and said received intended destination address.

16. A socket as in claim 15 wherein said communicating means includes networking means for operatively connecting said socket as a node on a local area network and for transmitting information on and receiving information from said local area network in a predetermined network protocol.

17. An integrated circuit socket for receiving an electrical integrated circuit device dual in line package, said device package having particular standard signal requirements associated therewith, said received integrated circuit device package including plural electrically conductive pin connections, said socket comprising:

a socket body;

plural electrical pin connecting means defined within said body for electrically connecting with corresponding plural conductive pins of said received integrated circuit device package;

optical communicating means, connected to said pin connecting means and also operatively connected to an optical local area network communicating data-encoded optical signals in a generic network protocol, said optical communicating means for communicating optically encoded data between said socket body and said local area network, said optical communications means providing a node on said local area network having a network address associated therewith, said communicating means including means for transceiving optically encoded data in said generic network protocol;

electrical data converting means connected to said optical communicating means for converting between optical and electrical data signals, said electrical data converting means including message buffering means connected to said electrical data converting means for buffering data to be optically transmitted by said optical communicating means and for buffering data to received by said optical communicating means; and electrical interface means connected between said electrical data converting means and said pin connecting means for providing particular electrical timing signals to said integrated circuit device package required by said received integrated circuit device package, and for applying electrical data signals to said received integrated circuit device package in a format and at an electrical level required by said package in response to said received buffered data.

18. An intelligent socket for receiving, supporting and interfacing with a conventional integrated circuit device having conventional electrical input and output signal requirements, said integrated circuit device including plural electrically conductive pin connections, said intelligent socket including:

a socket body detachably accepting and supporting said integrated circuit device;

plural conductive electrical signal connectors disposed on said socket body for electrically connecting with the electrically conductive pin connections of said integrated circuit device;

optical communicating means operatively coupled to said socket body for receiving and transmitting optical signals; and active circuit means, disposed within said socket body and operatively connected between said plural electrical connectors and said optical communicating means, for providing electrical input signals to said integrated circuit device in response to said optical signals received by said communicating means and for controlling said communicating means to transmit optical signals responsive to electrical output signals provided by said integrated circuit device.

19. A smart socket as in claim 18 wherein said active circuit means provides said electrical input signals in a standard format associated with said integrated circuit device, and said active circuit means includes storage means for specifying and for dynamically changing said standard format in accordance with the particular conventional integrated circuit device detachably coupled to said socket.

20. A data system comprising:

(a) a first intelligent socket for detachably receiving, supporting and electrically interfacing with a first integrated circuit device having plural electrically conductive pin connections, said first intelligent socket including:

a first socket body supporting said first integrated circuit device, a first set of conductive electrical signal connectors disposed on said socket body for electrically coupling with the electrically conductive pins of said first integrated circuit device, and first active circuit means, disposed within said first socket body and operatively connected to said first set of electrical connectors, for communicating electrical signals with said first integrated circuit device in a first signalling protocol particular to said first integrated circuit device;

(b) a second intelligent socket for detachably receiving, supporting and interfacing with a second integrated circuit device having electrically conductive pin connections, said second intelligent socket including:

a second socket body supporting said second integrated circuit device;

a second set of conductive electrical signal connectors disposed on said second socket body for electrically coupling with the electrically conductive pins of said second integrated circuit device, and second active circuit means, disposed within said second socket body and operatively connected to said second set of electrical connectors, for communicating electrical signals to and from said second integrated circuit device in a second electrical signalling protocol different from said first signalling protocol, said second protocol being particular to said second integrated circuit device; and (c) optical communication means, coupled between said first socket body and said second socket body, for communicating optical signals between said first and second active circuit means, said optical signals having a generic optical data signalling protocol different from said first and second electrical signalling protocols;

wherein said first active circuit means within said first socket body includes first protocol conversion means for generating electrical signals in said first electrical signalling protocol in response to said optical data signalling protocol signals communicated by said optical communications means, and said second active circuit means within said second socket body includes second protocol conversion means for generating signals in said second electrical signalling protocol in response to said generic optical data signalling protocol signals communicated by said optical communications means.

21. A system as in claim 20 wherein said optical communication means comprises means defining a free-space optical transmission link between said first and second sockets.

* * * * *